US010558428B2

(12) United States Patent
Rovers

(10) Patent No.: US 10,558,428 B2
(45) Date of Patent: Feb. 11, 2020

(54) FLOATING POINT TO FIXED POINT CONVERSION

(71) Applicant: Imagination Technologies Limited, Kings Langley (GB)

(72) Inventor: Kenneth Rovers, St Albans (GB)

(73) Assignee: Imagination Technologies Limited, Kings Langley (GB)

( * ) Notice: Subject to any disclaimer, the term of this patent is extended or adjusted under 35 U.S.C. 154(b) by 17 days.

(21) Appl. No.: 15/935,313

(22) Filed: Mar. 26, 2018

(65) Prior Publication Data

US 2018/0275960 A1  Sep. 27, 2018

(30) Foreign Application Priority Data

Mar. 24, 2017  (GB) .................................. 1704748.1

(51) Int. Cl.
G06F 5/01 (2006.01)
H03M 7/24 (2006.01)
G06F 7/48 (2006.01)

(52) U.S. Cl.
CPC ............ G06F 5/012 (2013.01); G06F 7/4824 (2013.01); H03M 7/24 (2013.01)

(58) Field of Classification Search
CPC ....................................................... H03M 7/24
(Continued)

(56) References Cited

U.S. PATENT DOCUMENTS 5,508,948 A   4/1996 Hatta
2003/0231121 A1  12/2003 Sakaguchi
(Continued)

FOREIGN PATENT DOCUMENTS

JP  H05173759 A  7/1993

OTHER PUBLICATIONS

GB Intellectual Property Office, Combined Search and Examination Report under Sections 17 & 18(3), IMA01-100930GB, Application No. GB 1704748.1, dated Sep. 21, 2017 (Year: 2017).*

Primary Examiner — Andrew Caldwell
Assistant Examiner — Emily E Larocque
(74) Attorney, Agent, or Firm — Vorys, Sater, Seymour and Pease LLP; Vincent M DeLuca

(57) ABSTRACT

A binary logic circuit converts a number in floating point format having an exponent E of ew bits, an exponent bias B given by $B=2^{ew-1}-1$, and a significand comprising a mantissa M of mw bits into a fixed point format with an integer width of iw bits and a fractional width of fw bits. The circuit includes a first shifter operable to receive a first significand input comprising a contiguous set of the most significant bits of the significand and configured to left-shift the input by a number of bits equal to the value represented by k least significant bits of the exponent to generate a first output, wherein $\min\{(ew-1), \text{bitwidth}(iw-2-s_y)\} \le k \le (ew-1)$ where $s_y=1$ for a signed floating point number and $s_y=0$ for an unsigned floating point number; an inverting unit configured to invert the bit values of the exponent; a second shifter coupled to the inverting unit configured to receive a second significand input comprising a contiguous set of the most significant bits of the significand and configured to right-shift the input by a number of bits equal to the value represented by the p least significant bits of the inverted exponent to generate a second output, wherein $\min\{(ew-1), \text{bitwidth}(fw)\} \le p \le (ew-1)$; and a multiplexer coupled to the first and second shifters and configured to: receive a first input comprising a contiguous set of bits of the first output and a second input comprising a contiguous set of bits of the second output; and output the first input if the most significant bit of the exponent is equal to one; and output the second input if the most significant bit of the exponent is equal to zero.

20 Claims, 13 Drawing Sheets

(58) Field of Classification Search
USPC .......................................................... 708/204
See application file for complete search history.

(56) References Cited

U.S. PATENT DOCUMENTS

| | | |
|---|---|---|
| 2016/0092168 A1 | 3/2016 | Lutz et al. |
| 2016/0211862 A1* | 7/2016 | Ho ........................ H03M 7/06 |
| 2017/0293467 A1* | 10/2017 | Lutz ....................... G06F 5/015 |

* cited by examiner

FLOATING POINT TO FIXED POINT CONVERSION

This invention relates to a binary logic circuit for converting a number from a floating point format to a fixed point format. In particular, certain aspects relate to circuitry that shifts the mantissa of a floating point number to convert the number to a fixed point format.

BACKGROUND

One way to represent numerical values is in floating point format. Floating point numbers are widely used within the field of computing due to their ability to represent a wide range of values with relatively few bits. A floating point number may be represented using binary bits. A schematic illustration of a binary floating point number is shown in FIG. 1. The floating point number comprises a sign field S (101), mantissa field M (105) and exponent field E (103). The sign field comprises a single sign bit. If the floating point number is an unsigned number, it may not comprise a sign field. The exponent field E comprises a set of ew bits.

The mantissa has a bit width of mw bits and forms part of the significand. The significand is given by the value Y.M, where Y is the leading bit of the significand and can either be '1' or '0'. When Y=1 the significand is referred to as 'normal' and when Y=0 the significand is referred to as denormal. For a given implementation, the value of the leading bit is typically fixed and can be referred to as an implicit bit. As such, only the mantissa M may be stored.

The sign bit denotes the sign of the floating point number. The exponent may either be a signed integer (typically in the range $-2^{ew-1} \leq E \leq 2^{ew-1}-1$, where ew is the number of exponent bits, or exponent width), or an unsigned integer (typically in the range $0 \leq E \leq 2^{ew}-1$). If the exponent is an unsigned integer, it is biased by an exponent bias B to give the 'true' exponent that determines the value of the floating point number.

Thus, in general, the value represented by a floating point number is given by $(-1)^{sign} \times 2^{E-B} \times \text{significand} = (-1)^{sign} \times 2^{E-B} \times Y.M$ Biasing the exponent allows the 'true' exponent (i.e. E−B) to be a negative or a positive integer whilst limiting the value in the exponent field E to an integer greater than or equal to zero. This is advantageous because it enables the relative sizes of exponents for different floating point numbers to be compared more easily than if the value in the exponent field was a signed integer.

Another way to represent numerical values is in a fixed point representation. In a fixed point representation the radix point (the point between the integer and fractional bits of the number) is at a fixed position in the numeral. This is in contrast to a floating point number, in which the radix point can move, or "float". A schematic illustration of a binary fixed point number is shown in FIG. 2. The fixed point number comprises an integer part 201 and a fractional part 203. The integer part and fractional part are separated by the radix point 205. The number of bits forming the integer part may be referred to as the integer width iw, and the number of bits forming the fractional part may be referred to as the fractional width fw. For a fixed point format with a given bitwidth, the number of bits used to represent the integer part (and therefore the fractional part) is fixed.

It is often desirable to convert a number between floating point and fixed point formats. For example, it may be less complex to perform certain arithmetic operations in hardware such as addition and subtraction on fixed point numbers due to the fixed position of the radix point. An example of a circuit for converting a floating point number to a fixed point number is shown in FIG. 3. The circuit 300 comprises a shifter 301 coupled to a subtraction unit 303 and a negation unit 305. The floating point number 100 to be converted is shown for the purposes of illustration.

The negation unit is configured to receive the sign bit of the floating point number as a first input, and the mantissa of the floating point number as a second input. The negation unit is configured to take the complement of the mantissa and output the result if the sign bit indicates the floating point number represents a negative value.

If the sign bit indicates that the floating point number represents a positive value, the negation unit does not take the complement of the mantissa and instead outputs the mantissa unaltered.

The subtraction unit receives as an input the exponent E of the floating point number and subtracts from that value the exponent bias B. The value of the bias may be fixed, or pre-determined, so that the subtraction unit is configured to subtract a fixed value from the exponent value. The value of the subtraction (E−B) is then output to the shifter 301.

The shifter 301 receives as a first input the mantissa M from the negation unit 305 and as a second input the value (E−B) from the subtraction unit 303. The shifter is operable to shift the mantissa left or right by a number of bits equal to the magnitude of the value of (E−B) to convert the floating point number to fixed point format. In particular, the shifter is configured to left-shift the mantissa by a number of bits equal to the value of (E−B) when (E−B) is greater than zero, and right-shift the mantissa by a number of bits equal to the value of (B−E) when the value of (E−B) is less than zero. The shifted mantissa is then output as the fixed point number. The output fixed point number may then be rounded. Examples of rounding modes include round-to-zero (RTZ), round-to-negative-infinity (RTN), round to positive infinity (RTP) and round-to-nearest-even (RNE).

The critical path of the binary circuit that determines the speed at which the circuit can convert a floating point number to a fixed point number may depend on the rounding mode and on whether the floating point number is signed or unsigned. For example, for an unsigned floating point number, the subtraction of the bias from the exponent is in the critical path of the circuit; for signed negative floating point numbers using RNI, the negation of the mantissa is in the critical path.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to a first aspect of the present disclosure there is provided a binary logic circuit for converting a number in floating point format having an exponent E of ew bits, an exponent bias B given by $B=2^{ew-1}-1$, and a significand comprising a mantissa M of mw bits into a fixed point format with an integer width of iw bits and a fractional width of fw bits, the circuit comprising:

a first shifter operable to receive a first significand input comprising a contiguous set of the most significant bits of the significand and configured to left-shift the input by a number of bits equal to the value represented by k least significant bits of the exponent to generate a first output, wherein min{(ew−1), bitwidth(iw−2−$s_y$)}≤k≤ (ew−1) where $s_y$=1 for a signed floating point number and $s_y$=0 for an unsigned floating point number;

an inverting unit configured to invert the bit values of the exponent;

a second shifter coupled to the inverting unit configured to receive a second significand input comprising a contiguous set of the most significant bits of the significand and configured to right-shift the input by a number of bits equal to the value represented by the p least significant bits of the inverted exponent to generate a second output, wherein min{(ew−1), bitwidth (fw)}≤p≤(ew−1); and a multiplexer coupled to the first and second shifters and configured to: receive a first input comprising a contiguous set of bits of the first output and a second input comprising a contiguous set of bits of the second output; and output the first input if the most significant bit of the exponent is equal to one; and output the second input if the most significant bit of the exponent is equal to zero.

The circuit may further comprise a first formatting unit coupled to the first shifter, the formatting unit configured to receive as an input a string comprising the mw mantissa bits and to format the string to generate the significand input to the first shifter.

The formatting unit may be configured to perform one or more formatting operations comprising appending (iw−2−$s_y$) bits to the most significant bit of the significand, where $s_y$=0 and the appended bits are zero bits for an unsigned floating point number, and $s_y$=1 and the appended bits are sign bits for a signed floating point number.

The first input of the multiplexer may be equal to the first output.

The first shifter may have a bit width equal to iw"+min (mw,(fw+iw")), where iw"=min{(iw−2−$s_y$), $2^{ew-1}$−2}.

The formatting unit may be configured to perform one or more formatting operations comprising appending (iw−1−$s_y$) bits to the most significant bit of the significand, where $s_y$=0 and the appended bits are zero bits for an unsigned floating point number, and $s_y$=1 and the appended bits are sign bits for a signed floating point number.

The circuit may further comprise a correction unit coupled to the first shifter and the multiplexer, the correction unit being configured to receive the first output and to discard its most significant bit and append a zero-bit to its least significant bit to form the first input to the multiplexer.

The first shifter may have a bit width equal to iw'+min (mw, (fw+iw')), where iw'=min{(iw−1−$s_y$), $2^{ew-1}$−1}.

The formatting unit may be further configured to truncate a set of least significant bits of the mw mantissa bits that would not form part of the fw bits of the fixed point format if left-shifted by a value equal to the shift range of the first shifter.

The first shifter may have a shift range limited to the minimum of: i) iw−2−$s_y$; and ii) $2^{ew-1}$−2

The floating point format and fixed point format may be such that (iw−$s_y$−1)≤$2^{ew-1}$−1, and k is equal to the bit width of the value (iw−$s_y$2), where $s_y$=1 for a signed floating point number and $s_y$=0 for an unsigned floating point number.

The floating point format and fixed point format may be such that $2^{ew-1}$−1≤(iw−$s_y$−1), and k=ew−1, where $s_y$=1 for a signed floating point number and $s_y$=0 for an unsigned floating point number.

The circuit may further comprise a second formatting unit coupled to the second shifter, the second formatting unit configured to receive as an input string comprising the mw mantissa bits and to format the string to generate the second significand input to the second shifter.

The formatting unit may be configured to truncate the (mw−fw) least significant bits of the mantissa when mw>fw.

The second shifter may have a bit width equal to: (1+$s_y$)+ min(fw, mw+$2^{ew-1}$−2).

The second shifter may have a shift range limited to the minimum of: i) $2^{ew-1}$−2; and ii) fw.

The circuit may further comprise a third formatting unit coupled to the second shifter, the third formatting unit being configured to append (iw−1−$s_y$) bits to the most significant bit of the second output, where $s_y$=0 and the appended bits are zero bits for an unsigned floating point number, and $s_y$=1 and the appended bits are sign bits for a signed floating point number.

The floating point format and fixed point format may be such that fw<$2^{ew-1}$−1 and p is equal to the bit width to represent fw.

The floating point and fixed point numbers may be such that fw≥$2^{ew-1}$−1 and p=ew−1.

The binary logic circuit may further comprise exception-handling circuitry configured to output an exception result in response to detecting an exception condition from a set of exception conditions comprising at least one of: i) E>B+ iw−1−$s_y$; ii) E≤B−fw, where $s_y$=1 for a signed number and $s_y$=0 for an unsigned number.

The binary logic circuit may further comprise an output multiplexer configure to multiplex between the exception result and the output from the multiplexer coupled to the first and second shifters.

According to another aspect of the present disclosure there is provided a method of converting a number in floating point format having an exponent E of ew bits, an exponent bias B given by B=$2^{ew-1}$−1, and a significand comprising a mantissa M of mw bits into a fixed point format with an integer width of iw bits and a fractional width of fw bits, the method comprising:

receiving at a first shifter a first significand input comprising a contiguous set of the most significant bits of the significand and left-shifting the input by a number of bits equal to the value represented by k least significant bits of the exponent to generate a first output, wherein min{(ew−1), bitwidth(iw−2−$s_y$)}≤k≤(ew−1) where $s_y$=1 for a signed floating point number and $s_y$=0 for an unsigned floating point number;

inverting at an inverting unit the bit values of the exponent;

receiving at a second shifter a second significand input comprising a contiguous set of the most significant bits of the significand and right-shifting the input by a number of bits equal to the value represented by the p least significant bits of the inverted exponent to generate a second output, wherein min{(ew−1), bitwidth (fw)}≤p≤(ew−1); and receiving at a multiplexer a first input comprising a contiguous set of bits of the first output and a second input comprising a contiguous set of bits of the second output and outputting the first input if the most significant bit of the exponent is equal to one and outputting the second input if the most significant bit of the exponent is equal to zero.

The method may further comprise receiving at a first formatting unit an input string comprising the mw mantissa bits and formatting the string to generate the significand input to the first shifter.

The step of formatting the string to generate the input to the first shifter may comprise appending (iw−2−$s_y$) bits to the most significant bit of the significand, where $s_y=0$ and the appended bits are zero bits for an unsigned floating point number, and $s_y=1$ and the appended bits are sign bits for a signed floating point number.

The first input of the multiplexer may be equal to the first output.

The first shifter may have a bit width equal to $iw''+\min(mw,(fw+iw''))$, where $iw''=\min\{(iw-2-s_y), 2^{ew-1}-2\}$.

The method may comprise performing one or more formatting operations comprising appending $(iw-1-s_y)$ bits to the most significant bit of the significand, where $s_y=0$ and the appended bits are zero bits for an unsigned floating point number, and $s_y=1$ and the appended bits are sign bits for a signed floating point number.

The method may further comprise receiving at a correction unit the first output and discarding its most significant bit and appending a zero-bit to its least significant bit to form the first input to the multiplexer.

The first shifter may have a bit width equal to $iw'+\min(mw, (fw+iw'))$, where $iw'=\min\{(iw-1-s_y), 2^{ew-1}-1\}$.

The method may further comprise truncating at the formatting unit a set of least significant bits of the mw mantissa bits that would not form part of the fw bits of the fixed point format if left-shifted by a value equal to the shift range of the first shifter.

The first shifter may have a shift range limited to the minimum of: i) $iw-2-s_y$; and ii) $2^{ew-1}-2$.

The floating point format and fixed point format may be such that $(iw-s_y-1)<2^{ew-1}-1$, and k is equal to the bit width of the value $(iw-s_y-2)$, where $s_y=1$ for a signed floating point number and $s_y=0$ for an unsigned floating point number.

The floating point format and fixed point format may be such that $(iw-s_y-1)>2^{ew-1}-1$, and $k=ew-1$, where $s_y=1$ for a signed floating point number and $s_y=0$ for an unsigned floating point number.

The method may further comprise receiving, at a second formatting unit coupled to the second shifter, an input string comprising the mw mantissa bits and formatting the string to generate the second significand input to the second shifter.

The method may comprise truncating at the second formatting unit the (mw−fw) least significant bits of the mantissa when mw>fw.

The second shifter may have a bit width equal to: $(1+s_y)+\min(fw, mw+2^{ew-1}-2)$.

The second shifter may have a shift range limited to the minimum of: i) $2^{ew-1}-2$; and ii) fw.

The floating point format and fixed point format may be such that $fw<2^{ew-1}-1$ and p is equal to the bit width to represent fw.

The floating point and fixed point numbers may be such that $fw \geq 2^{ew-1}-1$ and $p=ew-1$.

The method further may further comprise outputting an exception result in response to detecting an exception condition from a set of exception conditions comprising at least one of: i) $E>B+iw-1-s_y$; ii) $E\leq B+iw-1-s_y$, where $s_y=1$ for a signed number and $s_y=0$ for an unsigned number.

The method may further comprise multiplexing between the exception result and the output from the multiplexer.

According to another aspect of the present disclosure there is provided a binary logic circuit for converting a number in floating point format having an exponent E, an exponent bias $B=2^{ew-1}-1$, and a significand comprising a mantissa M of mw bits into a fixed point format with an integer width of iw bits and a fractional width of fw bits, the circuit comprising:

an offset unit configured to offset the exponent of the floating point number by an offset value to generate a shift value $s_v$ of sw bits, the offset value being equal to a maximum amount by which the significand can be left-shifted before overflow occurs in the fixed point format;

a right-shifter operable to receive a significand input comprising a formatted set of bits derived from the significand, the shifter being configured to right-shift the input by a number of bits equal to the value represented by k least significant bits of the shift value to generate an output result, where $\text{bitwidth}[\min(2^{ew-1}-1, iw-1-s_y)+\min(2^{ew-1}-2, fw)]\leq k\leq sw$, where $s_y=1$ for a signed floating point number and $s_y=0$ for an unsigned floating point number.

The offset unit may be configured to offset the exponent of the floating point number by a value equal to $(iw-1-s_y)$, where $s_y=1$ for a signed number and $s_y=0$ for an unsigned number.

The offset unit may be configured to generate a shift value given by $s_v=(B-E)+(iw-1-s_y)$.

The right-shifter may have a shift-range limited to: $[\min(2^{ew-1}-1, iw-1-s_y)+\min(2^{ew-1}-2, fw)]$ The floating point number may be a signed number and the binary logic circuit may further comprise a negating unit, the negating unit being configured to receive a sign bit indicating the sign of the floating point number, and an input comprising a set of most significant bits of the significand and to take the complement of those significand bits in dependence on the value of a sign bit of the number to generate a signed number in the form sY.M, where s represents the sign bit of the number, and Y represents the leading bit of the significand.

The binary logic circuit may further comprise a formatting unit coupled to the right-shifter and configured to truncate the $[mw-(iw+fw-(1+s_y))]$ least significant bits of the mantissa when $mw>(iw+fw-(1+sy))$.

The shifter may have a bitwidth equal to the minimum of: i) $iw+fw$; and ii) $1+s_y+mw+\min(2^{ew-1}-1, iw-1-s_y)+\min(2^{ew-1}-2, fw)]$.

The formatting unit may be coupled to the negating unit.

According to another aspect of the present disclosure there is provided a method of converting a number in floating point format comprising an exponent E, an exponent bias $B=2^{ew-1}-1$, and a significand comprising a mantissa M of mw bits into a fixed point format with an integer width of iw bits and a fractional width of fw bits, the method comprising:

offsetting the exponent of the floating point number by a value equal to a maximum amount by which the significand can be left-shifted before overflow occurs in the fixed point format to generate a shift value $s_v$ of sw bits;

receiving a significand input comprising a formatted set of bits derived from the significand at a right-shifter and right-shifting the input by a number of bits equal to the value represented by k least significant bits of the shift value to generate an output result, where $\text{bitwidth}[\min(2^{ew-1}-1, iw-1-s_y)+\min(2^{ew-1}-2, fw)]\leq k\leq sw$, where $s_y=1$ for a signed floating point number and $s_y=0$ for an unsigned floating point number.

The exponent may be offset by a value equal to $(iw-1-s_y)$, where $s_y=1$ for a signed number having a sign bit and $s_y=0$ for an unsigned number.

The shift value generated may be given by $s_v=(B-E)+(iw-1-s_y)$.

The right shifter may have a shift range limited to [min($2^{ew-1}$−1, iw−1−$s_y$)+min($2^{ew-1}$−2, fw)].

The method may further comprise receiving at a negating unit a sign bit of the floating point number and an input comprising a set of most significant bits of the significand, and taking the complement of those significand bits in dependence on the value of the sign bit to generate a signed number in the form sY.M, where s represents the sign bit of the number, and Y represents the leading bit of the significand.

The method may further comprise truncating at a formatting unit the [mw−(iw+fw−(1+$s_y$))] least significant bits of the mantissa when mw>(iw+fw−(1+$s_y$)).

The shifter may have a bitwidth equal to the minimum of: i) iw+fw; and ii) 1+$s_y$+mw+min($2^{ew-1}$−1, iw−1−$s_y$)+min($2^{ew-1}$−2, fw)].

According to another aspect of the present disclosure there is provided a binary logic circuit for converting a number in floating point format comprising an exponent E, an exponent bias B=$2^{ew-1}$−1, and a significand comprising a mantissa of mw bits into a fixed point format with an integer width of iw bits and a fractional width of fw bits, the circuit comprising:
  an offset unit configured to offset the exponent of the floating point number by an offset value to generate a shift value $s_y$ of sw bits, the offset value being equal to a maximum amount by which the significand can be right-shifted before underflow occurs in the fixed point format; and
  a left-shifter operable to receive a significand input comprising a formatted set of bits derived from the significand, the shifter being configured to left-shift the input by a number of bits equal to the value represented by k least significant bits of the shift value to generate an output result, where bitwidth[min($2^{ew-1}$−1, iw−1−$s_y$)+min($2^{ew-1}$−2, fw)]≤k≤sw and $s_y$=1 for a signed floating point number and $s_y$=0 for an unsigned floating point number.

The offset unit may be configured to offset the exponent of the floating point input by a value equal to fw.

The offset unit may be configured to generate a shift value given by $s_y$=(E−B)+fw.

The left-shifter may have a shift-range limited to: [min($2^{ew-1}$−1, iw−1−$s_y$)+min($2^{ew-1}$−2, fw)]

The floating point number may be a signed number and the binary logic circuit may further comprise a negating unit, the negating unit being configured to receive a sign bit and an input comprising a set of most significant bits of the significand and to take the complement of those significand bits in dependence on the value of a sign bit of the number to generate a signed number in the form sY.M, where s represents the sign bit of the number, and Y represents the leading bit of the significand.

The binary logic circuit may further comprise a formatting unit coupled to the left-shifter and configured to format the significand to left-align the significand with the fixed point format.

The formatting unit may be configured to append (iw+fw−(1+$s_y$)) bits to the leading bit of the significand, where $s_y$=0 and the appended bits are zero bits for an unsigned floating point number, and $s_y$=1 and the appended bits are sign bits for a signed floating point number.

The shifter may have a bit width of width$_{LS'}$, and the formatting unit may be configured to truncate [iw+fw+mw−width$_{LS'}$] least significant bits of the mantissa when (iw+fw+mw)>width$_{LS'}$.

The bit width of the shifter, width$_{LS'}$ may be equal to: iw+fw+min($2^{ew-1}$−1, iw−1−$s_y$)+min($2^{ew-1}$−2, fw)].

The formatting unit may be coupled to the negating unit.

The formatting unit may be configured to receive as an input the output from the negating unit.

According to another aspect of the present disclosure there is provided method of converting a number in floating point format comprising an exponent E, an exponent bias B=$2^{ew-1}$−1, and a significand comprising a mantissa of mw bits into a fixed point format with an integer width of iw bits and a fractional width of fw bits, the method comprising:
  offsetting the exponent of the floating point number by an offset value equal to a maximum amount by which the significand can be right-shifted before underflow occurs in the fixed point format to generate a shift value $s_y$ of sw bits; and
  receiving at a left-shifter a significand input comprising a formatted set of bits derived from the significand, and left-shifting the input by a number of bits equal to the value represented by k least significant bits of the shift value to generate an output result, where bitwidth[min($2^{ew-1}$−1, iw−1−$s_y$)+min($2^{ew-1}$−2, fw)]≤k≤sw, and $s_y$=1 for a signed floating point number and $s_y$=0 for an unsigned floating point number.

The exponent ma be offset by a value equal to fw.

The generated shift value may be given by $s_y$=(E−B)+fw.

The left-shifter may have a shift-range limited to: [min($2^{ew-1}$−1, iw−1−$s_y$)+min($2^{ew-1}$−2, fw)]

The floating point number may be a signed number and the method may further comprise receiving at a negating unit a sign bit indicating the sign of the number and an input comprising a set of most significant bits of the significand, and taking the complement of the significant bits in dependence on the a signed number in the form sY.M, where s represents the sign bit of the number, and Y represents the leading bit of the significand.

The method may further comprise formatting at a formatting unit the significand to left-align the significand with the fixed point format.

The step of formatting the significand may comprise appending (iw+fw−(1+$s_y$)) bits to the leading bit of the significand, where $s_y$=0 and the appended bits are zero bits for an unsigned floating point number, and $s_y$=1 and the appended bits are sign bits for a signed floating point number.

The shifter may have a bit width of width$_{LS'}$, and the formatting unit is configured to truncate [iw+fw+mw−width$_{LS'}$] least significant bits of the mantissa when (iw+fw+mw)>width$_{LS'}$.

The bit width of the shifter, width$_{LS'}$ may be equal to: iw+fw+min($2^{ew-1}$−1, iw−1−$s_y$)+min($2^{ew-1}$−2, fw)].

The binary logic circuits above may be embodied in hardware on an integrated circuit.

There may be provided a method of manufacturing, at an integrated circuit manufacturing system, a binary logic described herein.

There may be provided an integrated circuit definition dataset that, when processed in an integrated circuit manufacturing system, configures the integrated circuit manufacturing system to manufacture a binary logic circuit described herein.

There may be provided a non-transitory computer readable storage medium having stored thereon a computer readable description of an integrated circuit that, when processed in an integrated circuit manufacturing system, causes the integrated circuit manufacturing system to manufacture a binary logic circuit as described herein.

There may be provided an integrated circuit manufacturing system comprising: a non-transitory computer readable storage medium having stored thereon a computer readable description of an integrated circuit that describes a binary logic circuit as described herein;
   a layout processing system configured to process the integrated circuit description so as to generate a circuit layout description of an integrated circuit embodying the binary logic circuit; and
   an integrated circuit generation system configured to manufacture the binary logic circuit according to the circuit layout description.

BRIEF DESCRIPTION OF THE DRAWINGS

The present invention will now be described by way of example with reference to the accompanying drawings. In the drawings.

Where appropriate, like reference numerals have been used to denote like components

DETAILED DESCRIPTION

The present disclosure describes various binary logic circuits for converting a binary number in floating point format, or representation, to a fixed point format, or representation. A number in floating point format may be referred to herein as a floating point number, and similarly a number in fixed point format may be referred to as a fixed point number. The floating point number may have an unsigned integer exponent biased by an exponent bias. The binary logic circuits can be broadly classed into two types: those with a split-path shifter capable of left-shifting and right-shifting a mantissa; and those with a single shifter (either a single right-shifter or a single left-shifter) for shifting the mantissa. The split-path shifter is configured to shift the mantissa of the floating point number by a number of bits determined from the exponent of the floating point number. That is, the split-path shifter can determine the shift to apply to the mantissa by exploiting knowledge of the exponent and without having to perform the subtraction of the bias from the exponent. The single-shifter circuits are configured to offset the exponent bias of the floating point number by a value dependent on either the integer width or fractional width of the fixed point format to which the floating point is being converted. This enables the single-shifter circuits to convert the floating point number to fixed point format over a range of 'true' exponent values (i.e. for both positive and negative 'true' exponent values) using only a single shifter. The structure and operation of various examples of binary logic circuits are described in more detail below.

As used herein, the term 'significand' comprises a leading bit Y and a mantissa M separated by a radix point, i.e. the significand represents the value Y.M (=Y.0+0.M). The mantissa is formed of mw bits.

Split-Path Shifter

Figure 1:
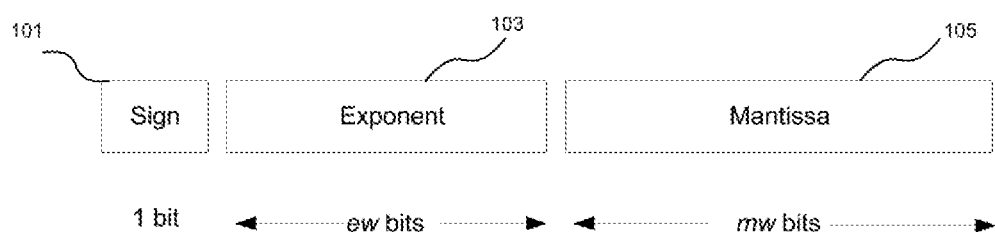
FIG. 1 shows a schematic illustration of a signed floating point number.
Figure 2:
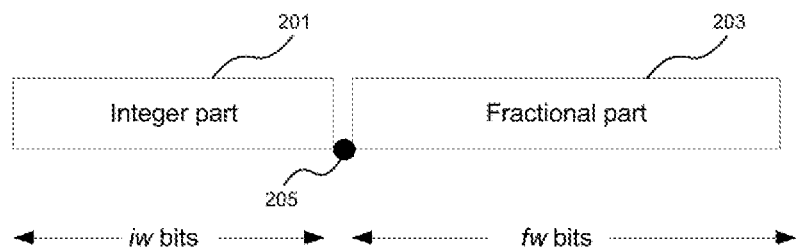
FIG. 2 shows a schematic illustration of a fixed point number.
Figure 3:
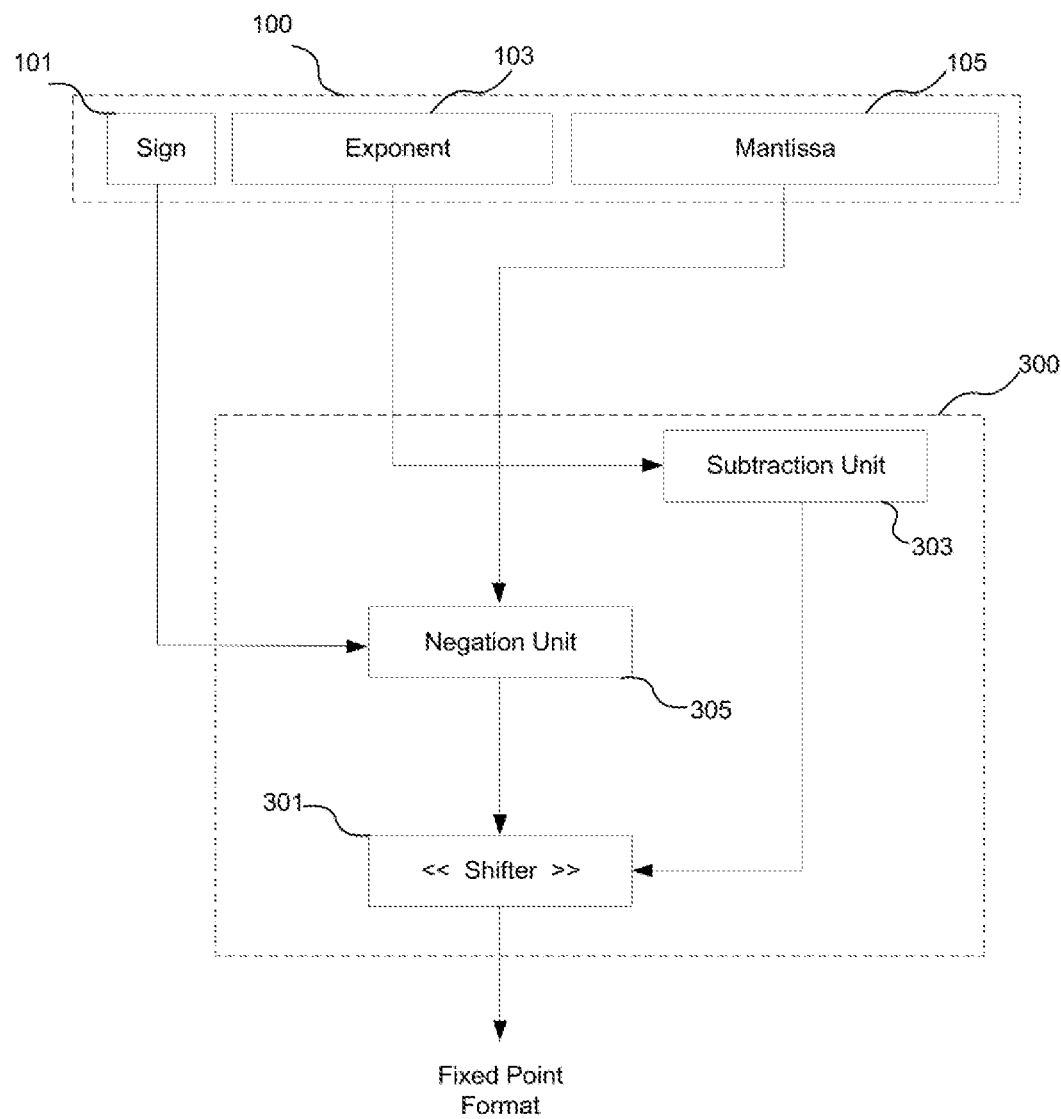
FIG. 3 shows an example of a logic circuit for converting a number in floating point format to fixed point format.
Figure 4:
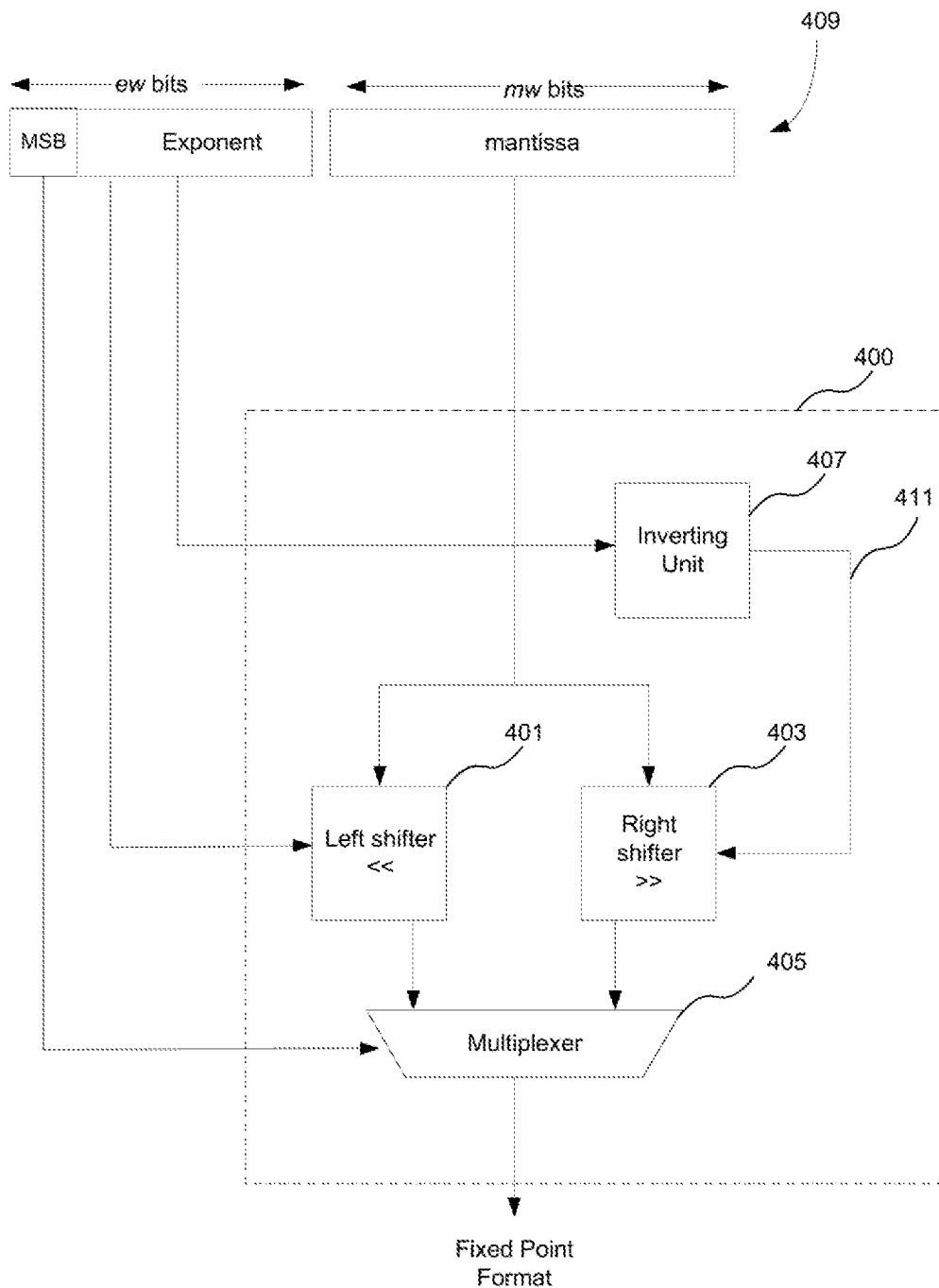
FIG. 4 shows an example of a split-path shifter for converting a number in floating point format to fixed point format without having to subtract the bias from the exponent.

FIG. 4 shows an example of a binary logic circuit 400 for converting a binary number in floating point format to a binary number in fixed point format. The binary number could be a signed number (i.e. comprising a sign bit) or an unsigned number (containing no sign bit). The fixed point number has an integer width of iw bits and a fractional width of fw bits. In other words, the fixed point number has an integer part of iw bits and a fractional part of fw bits. The fixed point number represents the value I.W. The value I.W could be in Siw.fw format, where 'S' indicates that it is a signed format, or Uiw.fw, where 'U' indicates it is an unsigned format.

The binary logic circuit is shown generally at 400 and comprises a left-shifter 401 and right-shifter 403 coupled to a multiplexer 405. The circuit further comprises an inverting unit 407 coupled to the right-shifter.

The floating point number to be converted is shown schematically at 409 and comprises an exponent field of ew bits representing the exponent E and a mantissa field of mw bits representing the mantissa M. For the purposes of simplicity, in this example the floating point is unsigned. The exponent is biased by an exponent bias B. The exponent bias is given by $B=2^{ew-1}-1$. The mantissa forms part of a significand comprising a leading bit Y and the mantissa M. The significand may be normal (i.e. the leading bit is '1') or denormal (i.e. the leading bit is '0'). The bitwidth of the mantissa is mw bits; and the bitwidth of the significand is (mw+1) bits. The floating point number therefore represents the value given by $2^{E-B} \times \text{significand} = 2^{E-B} \times Y.M$, where Y=1 for a normal floating point number and Y=0 for a denormal floating point number. The value (E−B) may be referred to as the 'true' exponent of the floating point number. In general, the value of the true exponent is used to determine the number of bits by which to shift the significand when converting the number from floating point format to fixed point format.

The inverting unit 407 is configured to receive the ew−1 least significant bits of the exponent E and to invert each received bit value of the exponent. That is, the inverting unit is configured to perform a bit-wise inversion on the bits of the exponent to generate a set of inverted exponent bits. Here, an inversion means that the binary value of a bit is inverted to its complementary value, e.g. a bit value of 1 is inverted to a 0, and a bit value of 0 is inverted to a 1. The inverting unit then outputs the ew−1 least significant bits of the inverted exponent on line 411. The inverted exponent may be denoted as $\bar{E}$.

Both the left-shifter 401 and the right shifter 403 are configured to receive as an input the mantissa M. The mantissa is an example of a more general significand input. The significand inputs may additionally comprise the leading bit Y of the significand, or else this may be separately received by each shifter, or added to the mantissa within the shifters to form the significand. Examples of other types of floating point input will be described below. Y may be assumed to be '1', with cases where Y=0 being treated as an exception. The left-shifter is configured to perform left-shift operations on its significand inputs to generate a first output, and the right-shifter is configured to perform right-shift operations on its significand inputs to generate a second output. The left-shifter and right-shifter may be barrel shifters, for example. The left-shifter is further configured to receive as an input the ew−1 least significant bits of the exponent E. The right-shifter is further configured to receive as an input the ew−1 least significant bits of the inverted exponent $\bar{E}$ output from the inverting unit 407.

The right shifter 403 is configured to right-shift the significand by a number of bits equal to the value represented by the ew−1 least significant bits of the inverted exponent $\bar{E}$. That is, the right-shifter is configured to shift the significand input to the right by a number of bits equal to the value represented by the binary string $\bar{E}$[ew−2:0] (i.e. the string represented by the $0^{th}$–(ew−$_2$)$^{th}$ bits of the inverted exponent, where the 0'th bit refers to the least significant bit). It has been found that, when the most significant bit of the exponent E is equal to 0, shifting the significand by the value represented by (ew−1) least significant bits of the inverted exponent $\bar{E}$ can be used to correctly shift the significand in accordance with the values of the exponent E and bias B without having to perform the subtraction of the bias from the exponent.

To see this, consider an example where, for simplicity, ew=5 and mw=8. In particular, consider an example in which E=00101 (i.e. E=5 in decimal format) and significand=1.0+0.M=1.0101001. The bias B is thus given by B=$2^{ew-1}$−1=15 (i.e. B=01111 in binary format), and $\bar{E}$=11010. The value represented by the floating point number is then given by $2^{E-B}\times 1.\text{mantissa}=2^{-10}\times 1.0101001$. That is, the value of the true exponent is equal to −10, which means the significand is to be shifted to the right by ten bits. In general, when the value of the true exponent (E−B) is negative, the significand is to be shifted to the right by a number of bits equal to the magnitude of the true exponent, i.e. the significand is to be shifted to the right by a number of bits equal to the value of (B−E). Turning to our specific example, (B−E)=01111−00101=01010. A comparison of this value with the inverted exponent $\bar{E}$ reveals that (B−E) is equal to the ew−1 (i.e. 4, in this example) least significant bits of the inverted exponent.

Thus by configuring the right shifter 403 to shift the significand to the right by a number of bits equal to the value represented by the (ew−1) least significant bits of the inverse of the exponent, the right shifter 403 can correctly shift the significand in accordance with the exponent E and bias B without having to subtract the bias from the exponent.

The left-shifter 401 is configured to left-shift the mantissa M (and hence the significand) by a number of bits equal to the value represented by the ew−1 least significant bits of the exponent E. That is, the left-shifter is configured to shift the significand input to the left by a number of bits equal to the value represented by the binary string E[ew−2:0] (i.e. the string represented by the $0^{th}$–(ew−2)$^{th}$ bits of the exponent). It has been found that, when the most significant bit of the exponent is equal to 1, shifting the significand by the value represented by (ew−1) least significant bits of the exponent can be used to shift the significand in accordance with the values of the exponent E and bias B without having to perform the subtraction of the bias from the exponent.

To see this, consider another example where E=11010 (i.e. E=26 in decimal format) and M=0101001. The bias B is again given by B=$2^{ew-1}$−1=01111 (i.e. B=15 in decimal format). The value represented by the floating point number is then given by $2^{E-B}\times 1.\text{mantissa}=2^{11}\times 1.0101001$, which means the significand is to be shifted to the left by 11 bits.

Instead of subtracting the bias B from the exponent, consider subtracting (B+1) from the exponent. B+1=$2^{ew-1}$=10000 in binary format. Thus (E−(B+1))=11010−10000=01010. A comparison of (E−(B+1)) with E reveals that the value of (E−(B+1)) is equal to the value represented by the four least significant bits of the exponent E. In general, when B=$2^{ew-1}$−1, (E−(B+1))=E[ew−2:0] when E(ew−1)=1. Thus, by configuring the left-shifter to left-shift the significand by a number of bits equal to the value represented by the ew−1 least significant bits of the exponent, the left-shifter can shift the significand to the left by a number of bits equal to (E−(B+1)) without having to subtract the bias from the exponent.

Shifting the significand to the left by a number of bits equal to (E−(B+1)) results in the significand being left-shifted by one bit less than indicated by the value of the true exponent (E−B). Approaches for correcting the shift are discussed below with reference to FIGS. 5, and 6A-6C but in one example, the left-shifter is configured to perform one additional shift to that indicated by the value of the ew−1 bits of the exponent E. That is, the left-shifter is configured to receive the exponent E, determine the value of its ew−1 least significant bits and left-shift the significand by a number of bits equal to that value plus one, i.e. the left-shifter is configured to left-shift its inputs by a value equal to the binary string E[ew−2:0]+1.

The multiplexer 405 is configured to receive as an input a contiguous set of the most significant bits of the exponent E. The contiguous set of the most significant bits may be a subset of the bits of the exponent that includes the most significant bits. The multiplexer may receive all ew bits of the exponent. In some examples, the multiplexer may receive only the most significant bit of the exponent (as shown in FIG. 4). The multiplexer is further configured to receive as inputs the first and second outputs from the left and right-shifter respectively.

The multiplexer 405 is configured to output the output from the left-shifter if the most significant bit of the exponent E is equal to one, and to output the output from the right-shifter if the most significant bit of the exponent E is equal to zero. Configuring the multiplexer in this way means the correct result from the shifters is output in accordance with the sign of the true exponent (E−B). That is, when B=$2^{ew-1}$−1, if the most significant bit of the exponent is equal to one, it follows that the value of (E−B)>0 and thus the significand is to be left-shifted when converting to fixed point format; and when the most significant bit of the exponent is equal to zero, the value of (E−B)≤0 and thus the significand is to be right-shifted when converting to fixed point format.

The above example illustrates the principle by which the left and right shifters can exploit the knowledge of the exponent to shift the significand without having to perform the step of subtracting the bias from the exponent. Thus binary logic circuit 400 is capable of converting a number from floating point to fixed point format without having to perform the operation of subtracting the bias from the exponent. This is advantageous because subtracting the bias from the exponent takes time and thus avoiding this operation may increase the speed at which a floating point number can be converted to a fixed point format. It may also reduce the hardware requirements of the circuit by negating the need for any circuitry to perform the subtraction.

Below, variations and examples of circuit 400 will be described that illustrate in more detail how the circuit may operate and how inputs to the circuit may be formatted for various kinds of floating point and fixed point formats, such as the size of the integer width, the fractional width, the number of bits of the exponent etc. Various optimisations of the circuit are also described.

The bit string of the significand may be formatted prior to being input to the shifters. The inputs to the left and right shifters may be separately formatted. The formatting may depend on whether the floating point inputs are signed or unsigned. In certain cases, depending on the size of the mantissa and the values of the integer width iw and fractional width fw, the formatting may include re-sizing the significand. The significand may need to be re-sized to the bitwidth of the left and/or right shifters (i.e. so that the number of bits in the re-sized significand is equal to the bit width of the shifter). Re-sizing may include appending one or more '0's to the most significant bit of the significand, also known as zero padding the leading bits of the significand.

Re-sizing may additionally include truncating one or more least significant bits of the mantissa. Bits may be truncated when it is known those bits will not be shifted into the fractional bits of the fixed point number (e.g. due to the limits on the maximum left-shift imposed by the bit-width ew of the exponent). Examples of how the binary logic circuit formats the significand are described with reference to FIGS. 5 and 6A to 6C.

Figure 5A:
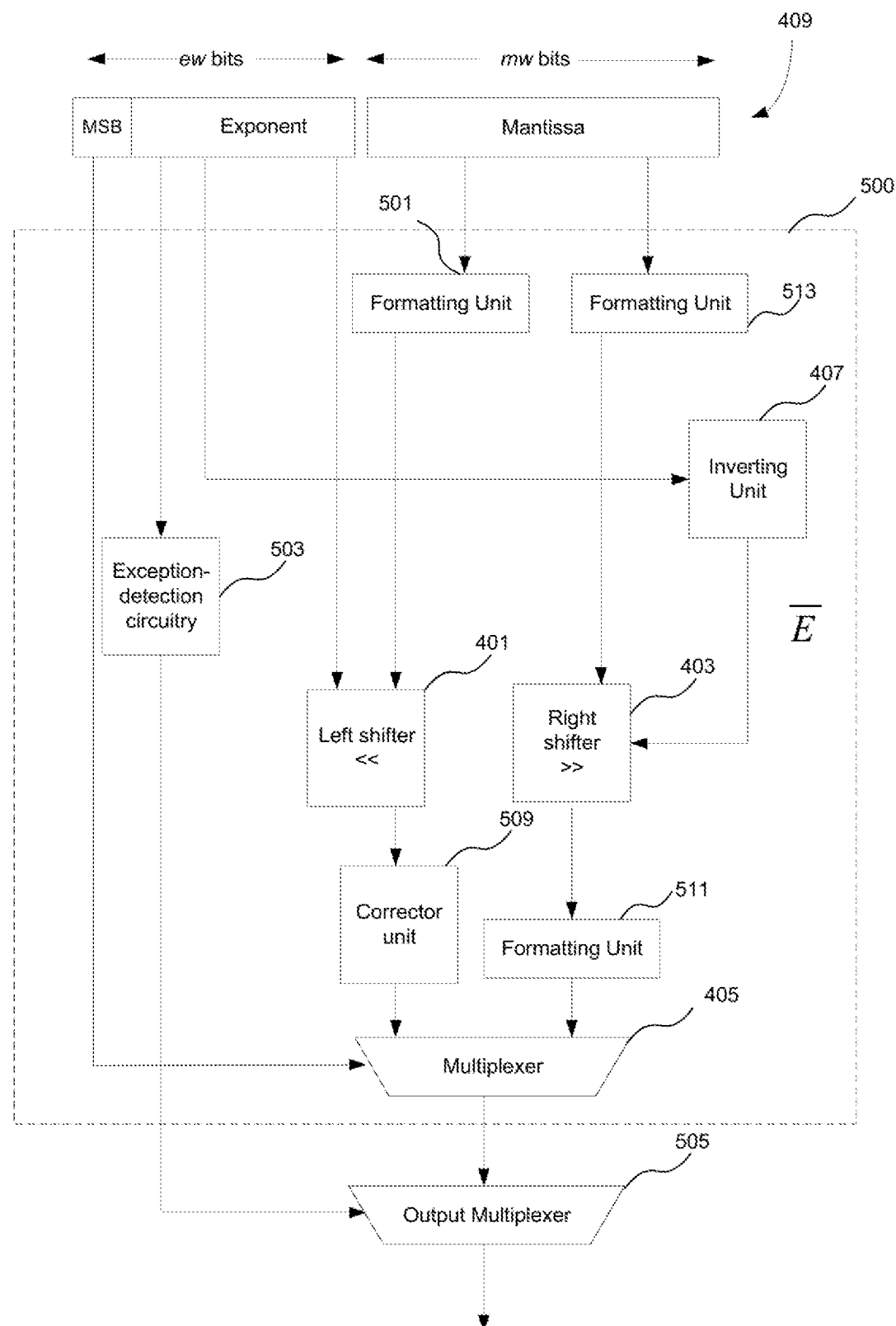
FIG. 5A shows an example of a binary logic circuit for converting an unsigned floating point number to a fixed point number.

FIG. 5A shows an example binary logic circuit 500 for converting an unsigned number in floating point format to a number in fixed point format. The floating point number represents the value given in general by $2^{E-B} \times$ significand=$2^{E-B} \times Y.M$, where E is again the exponent of ew bits, B is the exponent bias given by B=$2^{ew-1}-1$, Y is the leading bit of the significand and M is the mantissa having a width of mw bits. The fixed point number has an integer width of iw bits and a fractional width of fw bits.

As before, the binary logic circuit 500 comprises left-shifter 401 and right-shifter 403 coupled to multiplexer 405, and inverting unit 407 coupled to the right-shifter. The circuit 500 further comprises formatting units 501, 511 and 513. Formatting unit 501 is a pre-shift formatting unit for the left shifter 401; formatting unit 513 is a pre-shift formatting unit for the right-shifter 403; and formatting unit 511 is a post-shift formatting unit for the right-shifter 403. The formatting unit 501 is coupled to the left shifter 401; the formatting unit 513 is coupled to the right-shifter 403 and the formatting unit 511 is coupled to both the right shifter 403 and the multiplexer 405. The circuit further comprises a corrector unit 509 coupled to the left-shifter and the multiplexer 405 for incrementing the shift of the significand by one place to the left. Thus the corrector unit effectively corrects for the fact that the left-shifter only shifts the significand by (E−(B+1)) bits to the left, rather than (E−B) bits.

The circuit 500 further comprises exception-detection circuitry 503 configured to receive as an input the exponent E and optionally the mantissa M. The circuitry is coupled to an output multiplexer 505. The output multiplexer could form part of the binary logic circuit 500 or could be a separate component. The output multiplexer 505 is also coupled to the multiplexer 405. The circuitry 503 may be pre-configured to know, or have pre-stored thereon, the values of the integer width iw, fractional width fw and bias B and whether the numbers to be converted are signed or un-signed.

Operation of the circuit during a left-shift operation will now be described.

Figure 6A:
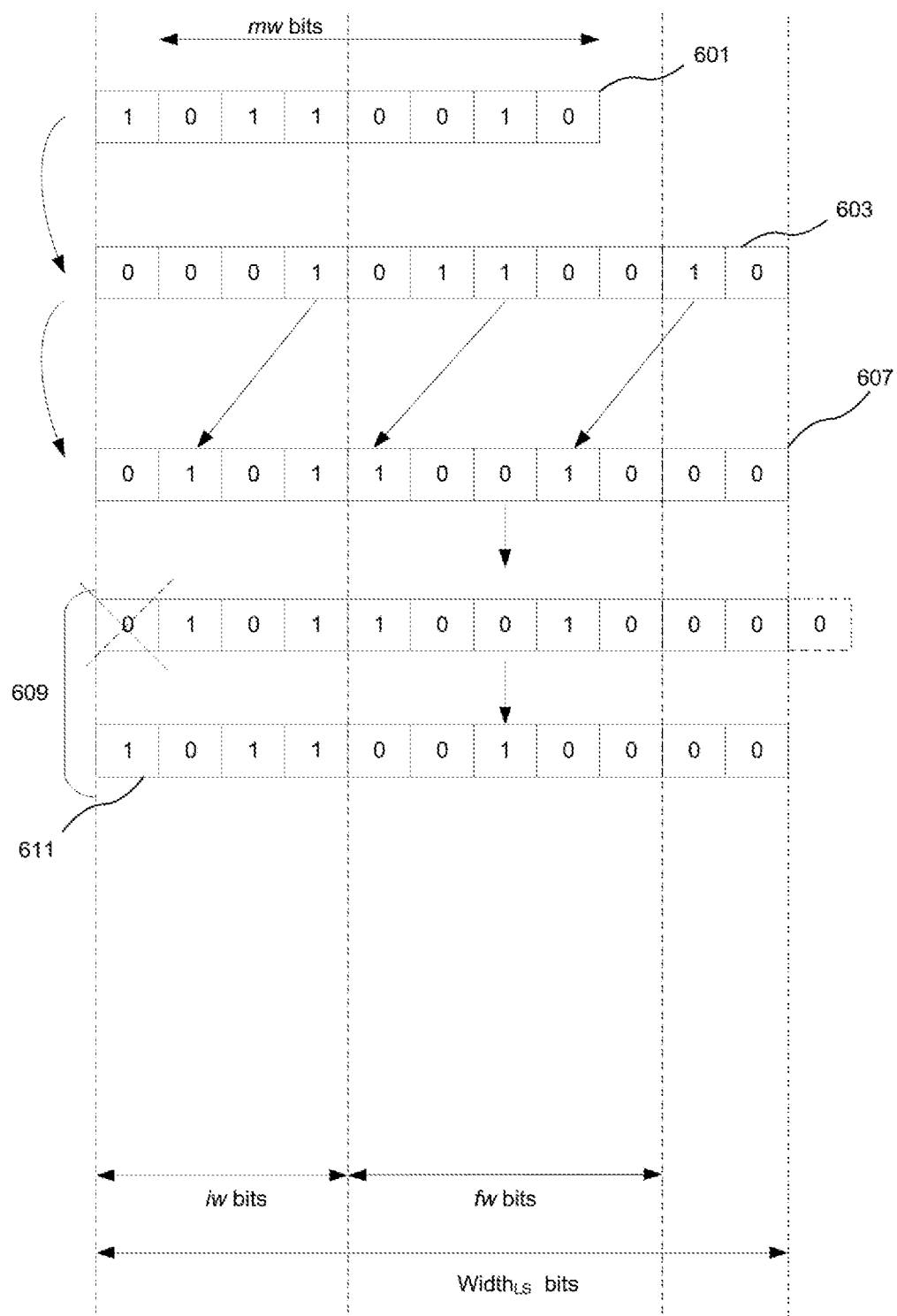
FIG. 6A shows a schematic illustration of how a significand may be formatted and left-shifted to convert the floating point number to a fixed point number.

The formatting unit 501 receives the mantissa M as an input and formats that input to generate a significand input to the left shifter. The formatting unit 501 may also receive the implicit leading bit Y of the significand (and so receive the whole significand as an input), or it may add the implicit high bit to the mantissa to form the significand. The formatting unit may format the significand by performing one or more formatting operations. The formatting unit may format the significand to generate a floating point input having a number of bits equal to the bit width of the left shifter 401. An illustration of this process is shown in FIG. 6A. In this example the floating point number is an unsigned floating point number having a significand given by 1.M=10110010 (i.e. mw=7), and is to be converted to a fixed point format having an integer part of 4 bits (i.e. iw=4) and a fractional part of 5 bits (i.e. fw=5).

FIG. 6A shows the bits of the significand 601 received at the formatting unit 501. For this example, the value of (E−B)=3 and so the significand is to be shifted to the left by 3 bits. The integer width iw and fractional width fw of the fixed point number is shown relative to the bits of the significand. The shifter width of the left shifter 401 is shown (denoted width$_{LS}$)

The formatting unit 501 appends (iw−1) zeros to the most significant bit of the significand (i.e. to the significand's leading edge). The formatting unit does this to align the significand with the radix point in the fixed point format. Thus, in this particular example the formatting unit appends 3 zeros to the leading bits of the significand to generate the binary string 00010110010, denoted 603. The significand is now aligned with the bit positions of the fixed point format so that the leading bit Y of the significand corresponds to the bit immediately to the left of the radix point separating the integer bits and the fractional bits, and the leading bit of the mantissa M corresponds to the bit immediately to the right of the radix point; i.e. the leading bit Y and the mantissa M are separated by the radix point.

In this example, the width of the left shifter, width$_{LS}$=iw+mw. Thus, once the formatting unit has 501 has appended the (iw−1) zero bits to the leading bit of the significand, the significand is formatted for input to the left-shifter (i.e. the formatted significand has a number of bits equal to the bit-width of the left-shifter).

Setting the bit width of the left-shifter to a value of iw+mw ensures that no bits of the significand are truncated prior to being input into the left-shifter, which is beneficial for providing an accurate shift result. However, in other examples, the bit-width of the left-shifter may be less than iw+mw (for example to reduce the hardware requirements of the shifter). In this case, the significand, having being formatted to append (iw−1) zero bits to its leading edge, may have a bit width greater than the bit width of the left shifter. In this case, the formatting unit 501 may truncate a number of least significant bits of the mantissa to reduce the number of bits to be equal to the bit width of the shifter 401. Mathematically, the formatting unit may truncate [mw+iw]−width$_{LS}$ least significant bits of the significand when width$_{LS}$<[mw+iw]. The truncated bits may be stored and taken into account for rounding the output result from the circuit 500. This rounding may be performed by a rounding unit (not shown in FIG. 5).

The formatting unit 501 outputs the re-formatted significand 603 to the left-shifter 401. Thus the shifters 401 receives as its input a contiguous set of the most significant bits of the significand. The set of most significant bits includes the leading bit of the significand (i.e. its most significant bit), but as illustrated in the examples above may not include some of the least significant bits of the mantissa (e.g. if the mantissa is truncated). The inputs may also include a set of leading zero bits appended, or concatenated, to the most significant bit of the significand.

The left-shifter 401 inspects the exponent to determine the value represented by the ew−1 least significant bits and shifts the significand to the left by that amount. As described above, this results in the left-shifter shifting the significand to the left by (E−(B+1)) bits. Thus in this example the left-shifter 401 left-shifts the re-formatted significand 603 by two bits (because E−B=3) to generate a shifted result 607. The shifted result, when interpreted in the fixed point format, represents the value 101.10010. It is noted that the shifted result 607 is to a greater precision than that allowed for by the fixed point format in this example. The binary logic circuit may comprise a rounding unit configured to round the shifted result to the number of fractional bits set by the fixed point format to handle such situations. The shifted significand 607 is then output from the left-shifter 401.

The output 607 from the shifter 401 is input to the corrector unit 509. The corrector unit is configured to increment the shift of the significand by one bit to the left. The result is that the significand is then correctly left-shifted by (E−B) bits. The corrector unit 509 could take the form of a constant shifter configured to left-shift its input by one place to the left. In this case the corrector unit may have a fixed shift range of one in order to minimise the required hardware and maximise the speed of the shifter. Alternatively the corrector unit may be configured to append a zero bit to the least significant bit of the re-formatted significand 607. In order to keep the bit width of the output 607 constant, the corrector unit may additionally discard the most significant bit of the output 607. This process is illustrated in FIG. 6A at 609. It can be seen that appending a zero least significant bit to the output 607 and discarding its most significant bit has the effect of left-shifting the output 607 one bit to the left. The generated result 611 is then output from the corrector unit 509 and input to the multiplexer 405.

An alternative approach to correct the left-shift is for the formatting unit 501 to append (iw−2) zero bits to the most significant bit of the significand, rather than (iw−1) zero bits. This as the effect of pre-shifting the significand by one place to the left, and is illustrated in FIG. 6C.

For clarity this example uses the same significand 601 and value of true exponent (E−B=3) as the example illustrated in FIG. 6A. The values of mw, iw, and fw are also the same as those shown in FIG. 6A.

The significand is shown at 601. The formatting unit 501 appends (iw−2) zero bits to the most significant bit of the significand (i.e. to its leading edge) to generate the formatted result 613. It should be noted that appending (iw−2) zero bits to the leading edge of the significand means that the leading bit of the significand is no longer aligned with the radix point (instead the significand is aligned one bit to the left of the radix point), unlike the formatted significand shown in FIG. 6A. Thus, appending (iw−2) '0' bits effectively results in an input to the left-shifter 401 that is left-shifted by one bit relative to a significand that is extended by (iw−1) zeros (e.g. as shown in FIG. 6A).

The formatted result 613 is then input into the left-shifter.

The left-shifter 401 inspects the (ew−1) least significant bits of the exponent to thereby left-shift the input 613 by (E−(B+1)) bits, which in this example is 2 bits, to generate the shifted result 617. An inspection of the shifted result 617 shows that the significand has been left-shifted by three bits with respect to the radix point of the fixed point format. That is, by appending (iw−2) '0' bits to the most significant bit of the significand to generate the input to the left shifter 401, the left-shifter causes the significand to be shifted to the left by the correct amount in accordance with the value of the true exponent (E−B). In other words, re-sizing the significand by extending its leading edge by (iw−2) zeros effectively introduces the extra left-shift required to supplement the shift performed by the shifter 401 (which, as described above, left-shifts the mantissa by (E−(B+1)) bits, rather than (E−B) bits in accordance with the true exponent).

Formatting the significand in this way is advantageous as it negates the need for the corrector unit 509, therefore reducing the hardware requirements of the circuit. It may also enable the size of the left-shifter to be reduced. For example, it can be seen that the width of the left shifter in the example of FIG. 6C is width$_{LS}$=iw+mw−1, compared to the width of iw+mw for the case shown in FIG. 6A.

Operation of the circuit during a right-shift operation will now be described.

The formatting unit 513 receives as its input the mantissa M and formats that input to generate a significand input to the right-shifter 403. The formatting unit 513 may additionally receive the implicit leading bit of the significand as part of the significand input, or it may internally add this bit to the mantissa M to form the significand. The formatting unit 513 performs one or more formatting operations to format the significand for input to the right shifter 403. In particular, the formatting unit formats the significand to generate a second significand input having a number of bits equal to the bitwidth of the right shifter 403. An illustration of this process is shown in FIG. 6B for the case of an unsigned number (i.e. $s_y$=0).

Figure 6B:
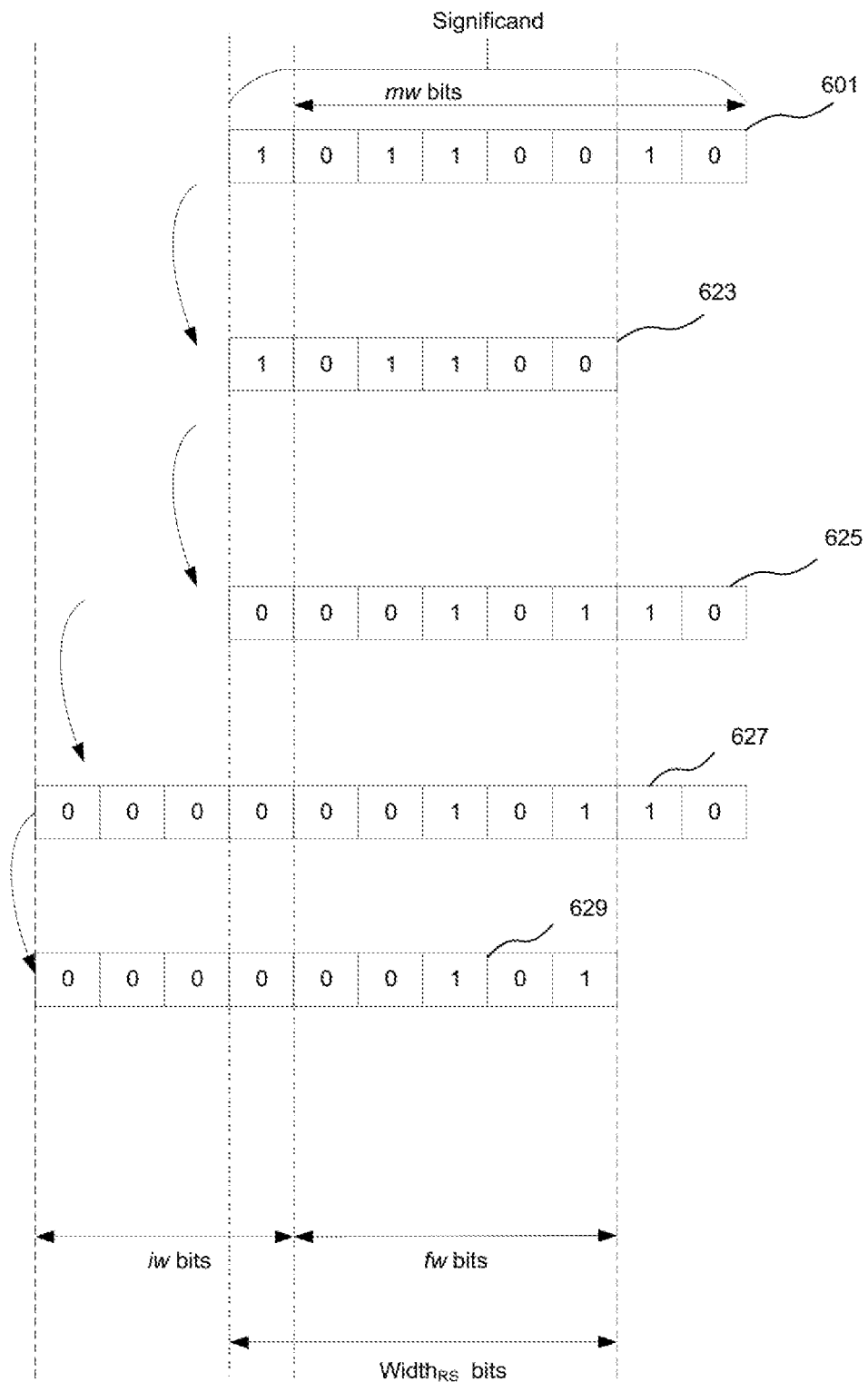
FIG. 6B shows an alternative schematic illustration of how a significand may be formatted and right-shifted to convert the floating point number to a fixed point number.
Figure 6C:
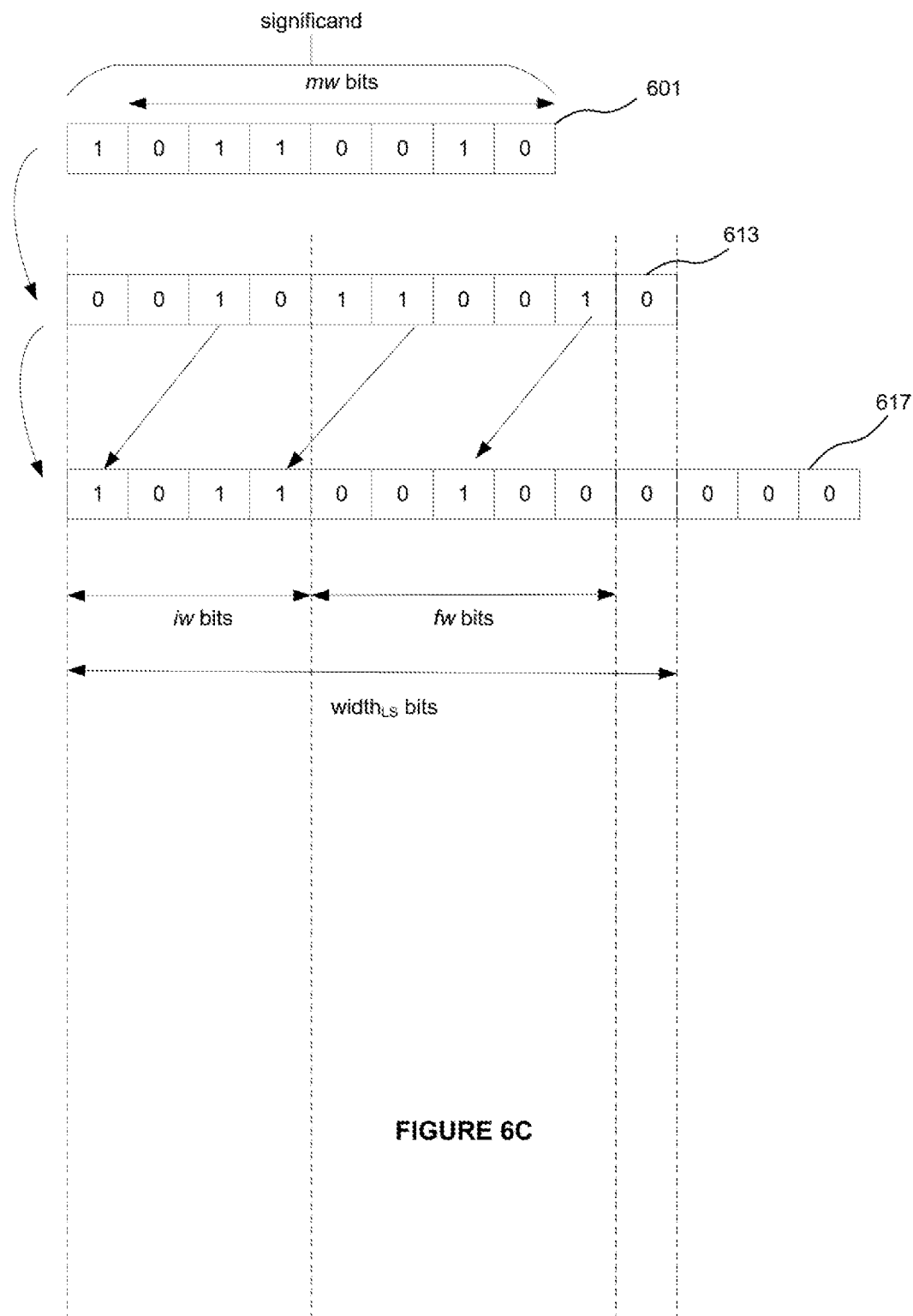
FIG. 6C shows a schematic illustration of how a significand may be formatted and left-shifted to convert the floating point number to a fixed point number.

FIG. 6B shows the bits of the significand 601, but for this example to illustrate the operation of the right shifter the value of (E−B)=−3 and so the significand is to be shifted to the right by three bits. The integer width iw and fractional width fw are again shown, along with the bit width of the right shifter, denoted width$_{RS}$.

The value of width$_{RS}$ in this example is equal to fw+1, exploiting the fact that, since the right shifter shifts its inputs to the right, any additional bits beyond the fw$^{th}$ bit would not appear in the shifted result.

Thus, in this example the mantissa width and the width of the right shifter 403 are such that (mw+1)>width$_{RS}$. The formatting unit may therefore truncate a number of the least significant bits of the mantissa equal to the value ((mw+1)−width$_{RS}$). This would re-size the significand to be equal to the bitwidth of the right-shifter 403. Again, these truncated bits may be stored and taken into account for rounding the output result. This rounding may be performed by the rounding unit (not shown). In this example, the formatting unit truncates the two least significant bits of the mantissa to generate the reformatted significand 623.

Formatting unit 513 outputs the reformatted significand 623 to the right-shifter 403.

The right-shifter 403 inspects the inverted exponent $\bar{E}$ to determine the value represented by its (ew−1) least significant bits and shifts the significand to the right by that amount. Thus in this example the right-shifter shifts the significand to the right by 3 bits (because (E−B)=−3) to generate the shifted result 625.

It will be noted that the formatting unit 513 does not in this example append any bits to the leading edge of the significand. Because the shifter 403 only shifts to the right, it does not require any bits to be appended to the leading edge of the significand. Instead, the right-shifter 403 outputs the shifted result 625 into formatting unit 511, which re-sizes the shifted result to iw+fw bits (i.e. into a number in iw.fw format). Having the formatting unit 511 resize the shifted result into the fixed point format advantageously enables the bitwidth of the shifter 403 to be reduced in size.

The operation of formatting unit 511 is illustrated in FIG. 6B. Formatting unit 511 appends (iw−1) zero bits to the leading edge of the significand so as to align the shifted result with the radix point of the fixed point format. The resultant binary string is shown at 627. This generates the output result 629 sized to (iw+fw) bits. Conversely, if width$_{RS}$<fw+1, the formatting unit 511 appends (f, +1)−width$_{RS}$ zero bits to the least significant bit, or trailing edge, of the shifted result 625 to generate an output result sized to (iw+fw) bits.

The resized shifted result 629 is then output from the formatting unit 511 to the multiplexer 405.

As discussed above, shifting the significand to the right by the value represented by the ew−1 least significant bits of the inverted exponent $\bar{E}$ causes the significand to be right-shifted by (B−E) bits (when B>E). Thus the right-shifter can output a correctly shifted result without a corrector unit being required between the shifter 403 and multiplexer.

In general, the multiplexer 405 therefore receives a first input comprising a contiguous set of bits of the output from the left-shifter, and a second input comprising a contiguous set of bits of the output from the right-shifter. The first input may comprise all but the most significant bit of the left-shifter output, e.g. if the corrector unit 509 discards the most significant bit. Alternatively, the first input may be equal to the output from the left-shifter, for example if the circuit doesn't include corrector unit 509. The contiguous set of bits in the second input comprises the most significant bit of the output from the right shifter.

The exception-detecting circuitry 503 is configured to detect whether the value of the exponent would cause either underflow or overflow in the fixed point format. Overflow will occur when E−B>iw−1−s$_y$, and underflow will occur when (B−E)>fw. The circuitry 503 may be configured to analyse the exponent to detect the condition E>B+iw−1−s$_y$ (the overflow condition) and/or the condition E<B−fw (the underflow condition). The circuitry 503 could be configured to output an indication of an exception in response to detecting an exception condition (e.g. the underflow and/or overflow condition). The circuitry 503 may also output a first exception value, or result, in response to detecting the overflow condition, and a second exception value in response to detecting the underflow condition. The first exception value could for example be the maximum representable value in fixed point format. The circuitry could optionally be configured to receive the sign bit of the floating point number (if the number is signed). In this case, the circuitry may output the maximum representable number in fixed point format in response to detecting that the overflow condition and if the sign bit indicates the number is positive, and output the minimum representable number in fixed point format in response to detecting the overflow condition and if the sign bit indicates the number is negative.

The exception-detection circuitry may additionally be configured to detect zero and infinity conditions, corresponding to when the mantissa M has a value of zero or its maximum representable value. In response to detecting the zero condition, the circuitry 503 may output zero as the exception result. In response to detecting the infinity condition, the circuitry 503 may output an indication of infinity, or possibly NaN (not-a-number).

The exception-detection circuitry 503 may also be configured to detect denormal inputs (i.e. inputs where Y=0) and to treat those as exceptions. To do this, the circuitry 503 may be configured to receive the implicit high bit 'Y' as an input, and to detect that the input 409 is denormal in response to detecting that the Y bit has a value of zero.

The circuitry 503 outputs the indication of the exception and the exception result to the output multiplexer 505.

The output multiplexer 505 is configured to multiplex between an exception result and the output from multiplexer 405 (the shifted result). The multiplexer 505 may be configured to output the exception result in response to receiving an indication of an exception from the circuitry 503. If no indication of an exception is received, the multiplexer 505 outputs the shifted result received from multiplexer 405. For example, the exception detection circuitry 503 may output a no-detection signal (e.g. a sequence of 0's or 1's) at times when no exception conditions are detected, and output the indication of an exception (e.g. a complementary signal to the no-detection signal) when an exception condition is detected. The output multiplexer 505 could then output the shifted result when the no-detection signal is received from circuitry 503, and the exception result when an indication of an exception condition is received.

The exception-detection circuitry 503 may advantageously operate in parallel with the remaining components of the binary logic circuit so that the detection of any exception conditions does not significantly delay the operation of the circuit. Furthermore, by configuring the exception-detection circuitry to detect the overflow or underflow conditions by comparing the value of the exponent E (rather than, for example, the true exponent (E−B)), the speed of the circuitry may be improved. This is because the values of B, iw and fw may be pre-loaded onto the circuitry, and thus the circuitry can simply compare the value of the variable (the exponent E) against pre-stored values. It also avoids the circuitry having to perform the subtraction of (E−B) to detect the underflow of overflow conditions.

Figure 5B:
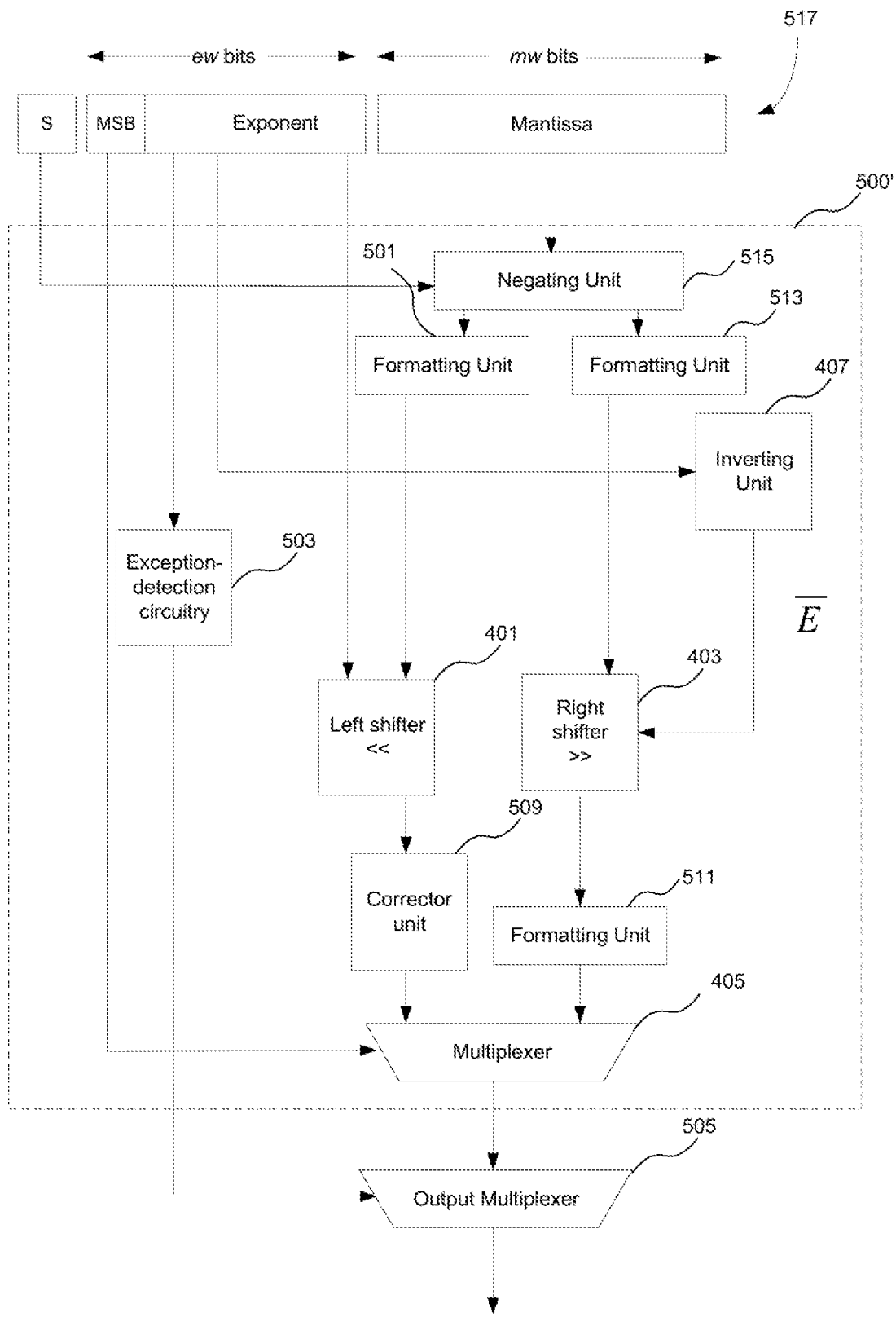
FIG. 5B shows an example of a binary logic circuit for converting a signed floating point number to a fixed point number.

A modification of circuit 500 for converting signed floating point numbers into fixed point format is shown in FIG. 5B. The circuit is shown generally at 500', with the signed floating point number to be converted being shown at 517. The circuit comprises a negating unit shown at 515. The negating unit 515 receives as an input the mantissa M and sign bit. It could internally add the implicit high bit Y to form the significand, or otherwise receive this bit as an input. The output from the negating unit 515 could be a signed number in the form SY.M, where S denotes the sign bit, Y denotes the high bit of the significand and M denotes the mantissa.

The output SY.M is fed as an input to the formatting unit 501. In the case of post-shift correction by corrector unit 509, the formatting unit 501 operates to append (iw−2) sign bits to the leading bit of the number SY.M outputted by negating unit 515 to generate the input to the left-shifter 401. Thus, in general, for the case of post-shift correction the formatting unit may operate to append (iw−1−$s_y$) bits to the leading bit of its received input, where the $s_y$=1 and the appended bits are sign bits for signed floating point numbers, and $s_y$=0 and the appended bits are zero bits for unsigned floating point numbers.

In the case of pre-shift correction, the formatting unit 501 operates to append (iw−3) sign bits to the leading bit of the signed number outputted by the negating unit 515 to generate the input to the left shifter 401. Thus, in general, for the case of pre-shift correction the formatting unit may operate to append (iw−2−$s_y$) bits to the leading bit of its received input, where the $s_y$=1 and the appended bits are sign bits for signed floating point numbers, and $s_y$=0 and the appended bits are zero bits for unsigned floating point numbers.

The formatting unit 513 receives the signed number SY.M from the negating unit, and may truncate a number of the least significant bits of the mantissa equal to the value ((mw+1+1)−$\text{width}_{RS}$) when the mantissa width is such that (mw+1+1)>$\text{width}_{RS}$. Thus, in general, the formatting unit 513 may truncate a number of least significant bits of the mantissa equal to the value [(mw+1+$s_y$)−$\text{width}_{RS}$)] when (mw+1+$s_y$)>$\text{width}_{RS}$. In the case of signed numbers, the width of the right shifter may be set to (1+fw+1). Thus, in general, the width of the right shifter 403 may be equal to (1+fw+$s_y$), where $s_y$=0 for unsigned numbers and $s_y$=1 for signed numbers For signed floating point inputs, the formatting unit 511 may operate to append (iw−2) sign bits to the leading bit of the output from the right shifter 403. Thus, in general, the formatting unit 511 may append (iw−1−$s_y$) bits to the leading bit of the right shifter output, where the $s_y$=0 and the appended bits are zero bits in the case of unsigned floating point inputs, and $s_y$=1 and the appended bits are sign bits in the case of signed floating point inputs.

In an alternative arrangement of circuit 500', the negating unit 515 could be arranged between the formatting units 501, 513 and the left and right shifters, so that the negating unit receives as its inputs the outputs of the formatting units, and outputs its values to the left and right shifters.

A number of optimisations may be made to minimise the bit width of the shifters 401, 403 and/or their shift range for the circuits 500 and 500' In the following, it is noted that $s_y$=0 for unsigned floating point numbers, and $s_y$=1 for signed floating point numbers.

It has been appreciated that the maximum amount by which the significand can be shifted is governed either by the size of the integer widths iw and fw or the exponent width ew. Considering the left-shift case first, it is noted that the value (iw−1−$s_y$) represents the maximum amount by which the significand can be left-shifted before overflow occurs given the fixed point format. The value $2^{ew-1}-1$ represents the maximum left-shift as determined from the true exponent E−B and occurs when E=$2^{ew}-2$ (E=$2^{ew}-1$ being an exception result). Thus, if $2^{ew-1}-1$<iw−$s_y$−1, then the maximum left-shift is governed by the exponent width and overflow does not occur even when the true exponent takes its maximum value. Conversely, if iw−$s_y$−1<$2^{ew-1}-1$, then the exponent is capable of taking values that would cause overflow to occur (i.e. that would cause the most significant bit of the result to be shifted out of the fixed point format). In this case the maximum left-shift is governed by the value (iw−$s_y$−1). Thus, if overflow is handled as an exception result, the left-shift range can be limited to the minimum of: iw−1−$s_y$; and ii) $2^{ew-1}-1$.

However, the total left-shift to which the significand is subjected is formed of two components: i) the shift performed by the shifter 401; and ii) the single shift correction (applied either pre or post shift). Thus, the range of the shifter 401 can be limited to one less than the value of the total left-shift range. In other words, the shifter 401 can be optimised by limiting its shift range to the minimum of: i) iw−2−$s_y$; and ii) $2^{ew-1}-2$. It is noted that, as used herein, a shift range of 'n' is taken to mean a shifter is capable of shifting an input from 0 up to and including n bits. In other words, the shifter 401 may be configured to shift its inputs by any value in the range 0-min[(iw−2−$s_y$), $2^{ew-1}-2$]. This ensures the total left-shift of the significand is limited to the minimum of iw−1−$s_y$ and $2^{ew-1}-1$ once the shift correction has been applied.

It may be advantageous to limit the range of the shifter to minimise its hardware requirements and maximise its speed. For example, some shifters (for example barrel shifters) may comprise one multiplexer per bit of the shift-range bitwidth. The bitwidth of the shifter may refer to the number of bits required to represent the range of the shifter. For example, if a shifter has a shift-range of 255 bits, the shifter requires 8 bits to cover this range; i.e. an 8-bit shifter is capable of shifting an input by a maximum of 255 bits. If the shift range is limited, the number of multiplexers forming the shifter may be decreased, which in turn may increase the speed of the shifter.

If overflow cannot occur even when the exponent takes it maximum value, then the left shifter 401 may be configured to left-shift the significand by a number of bits equal to the value represented by the ew−1 least significant bits of the exponent.

If overflow can occur (i.e. if iw−$s_y$−1<$2^{ew-1}-1$), then the left-shifter need only inspect the k least significant bits of the exponent to determine the shift, where k=bitwidth(iw−$s_y$−2)=ceiling{$\log_2$(iw−$s_y$−1)}. In general, bitwidth(n)=ceiling{($\log_2$(n+1)}, where bitwidth(n) is the function that gives the number of bits required to represent a value in the range of 0 up to n (i.e., n+1 different values). It is noted that k=bitwidth(iw−$s_y$−2), rather than bitwidth(iw−$s_y$−1), due to the additional correction applied to the left shift (applied either pre-or-post correction).

The shifter 401 does not need to know the values of the (ew−k) most significant bits of the exponent because if any of those bits are non-zero, then the value of the true exponent (E−B) would cause overflow anyway (and so may be handled separately as an exception result). For cases where all of the (ew−k) most significant bits of the exponent are zero, then the same shift value is obtained from inspecting k least significant bits as from inspecting >k least significant bits.

Of course, the left-shifter may be configured to inspect (ew−1) bits of the exponent regardless of the values of ew and iw (with overflow conditions being handled by exception-detection circuitry). Thus in general, in order for the shifter 401 to give the correct shift result k is at least equal to the minimum of: i) (ew−1); and ii) bitwidth (iw−2−$s_y$), but it is noted that the circuit may be optimised by configuring the left-shifter to shift its inputs to the left by the value represented by k least significant bits of the exponent E, where k=ew−1 when $2^{ew-1}-1$≤iw−$s_y$−1, and k=bitwidth(iw−$s_y$−2) when iw−$s_y$−1<$2^{ew-1}-1$.

The values of the integer width iw, fractional width fw and mantissa width mw can also be exploited to optimise the width width$_{LS}$ of the left shifter 401.

With reference to FIG. 6A, it can be appreciated that, for the case of post-shift correction (e.g. by corrector unit 509), if mw≤fw, the value of width$_{LS}$ can be reduced to iw'+mw, where iw' is the maximum amount the significand can be left-shifted, i.e. iw'=min{(iw−1−s$_y$), $2^{ew-1}$−1}. Conversely, if mw>fw, the value of width$_{LS}$ can be reduced to (iw'+fw+iw')(i.e. the output range plus the shift range). Thus, the width of the shifter can be optimised by noting that width$_{LS}$=iw'+min(mw, (fw+iw')).

For the case of pre-shift correction (i.e. when the maximum left-shift, iw"=min[(iw−2−s$_y$), $2^{ew-1}$−2], if mw≤fw+1 then the shifter width width$_{LS}$ can be reduced to iw"+mw. Conversely, if mw>fw+1, then the shifter width width$_{LS}$ can be reduced to (iw"+fw+iw". Thus for the case of pre-shift correction the width of the shifter can be optimised by noting that width$_{LS}$=iw"+min(mw, (fw+iw"). It will be noted that the width of the left shifter can therefore be reduced when pre-shift shift correction is applied compared to when post-shift shift correction is applied.

Turning now to the right-shift case, it has been appreciated that the maximum amount by which the significand can be right-shifted before underflow occurs is fw.

The maximum right shift as governed by the true exponent (E−B) is $2^{ew-1}$−2, which occurs when E=1 (E=0 being an exception result). The exponent width may govern the maximum right-shift when $2^{ew-1}$−2≤fw, i.e. when underflow cannot occur even when the exponent takes its minimum value. Conversely, if fw<$2^{ew-1}$−2 then the exponent is capable of taking values that would cause underflow to occur. In this case the maximum right-shift is governed by the value fw.

If underflow cannot occur even when the exponent takes its minimum value, then the right-shifter 403 may be configured to right-shift the significand by a number of bits equal to the value represented by the ew−1 bits of the inverted exponent.

If underflow can occur (i.e. if fw<$2^{ew-1}$−2), then the right-shifter need only inspect the p least significant bits of the inverted exponent to determine the shift, where p=bitwidth(fw). The right-shifter 403 does not need to know the values of the (ew−p) most significant bits of the inverted exponent because in the event that any of those bits are non-zero, the value of the true exponent would cause underflow anyway (and so may be handled separately as an exception result). If all of the (ew−p) most significant bits of the inverted exponent are zero, then the same right-shift value is obtained from inspecting p least significant bits as from inspecting >p least significant bits.

The right-shifter may be configured to inspect (ew−1) least significant bits of the inverted exponent regardless of the values of ew and fw (since this will give the correct amount by which to shift right), and thus in general for the shifter 403 to give the correct result p is greater than or equal to the minimum of: i) (ew−1); and ii) bitwidth (fw), but it is noted the circuit may be optimised by configuring the right-shifter to right-shift its inputs by the value represented by p least significant bits of the inverted exponent, where p=ew−1 when $2^{ew-1}$−2<fw and p=bitwidth(fw) when fw<$2^{ew-1}$−2.

Similarly to the left shifter, the range of the right shifter may be limited to the maximum right shift. Thus for floating and fixed point formats where $2^{ew-1}$−2≤fw, the range of the right shifter 403 may be limited to the value of $2^{ew-1}$−2 because the right shifter would not need to shift any more than this value regardless of the exponent value. If instead the floating and fixed point formats were such that fw<$2^{ew-1}$−2 then the range of the shifter may be limited to the value of fw (there being no need to shift any more than this otherwise underflow would occur). Thus right-shifter 403 may be optimised by limiting its shift range to the minimum of: i) $2^{ew-1}$−2; and ii) fw.

The values of the mantissa width mw, exponent width ew and the fractional width fw can be exploited to optimise the width width$_{RS}$ of the right shifter 403.

With reference to FIG. 6B, it can be appreciated that, when mw>fw, the value of width$_{RS}$ can be reduced to (1+s$_y$+fw). If mw<fw, the value of width$_{RS}$ can be set to (1+s$_y$+mw+$2^{ew-1}$−2), which may or may not exceed the value (1+s$_y$+fw) depending on the values of mw, ew and fw. Thus, it has been appreciated that the size of the right-shifter can be optimised by noting that width$_{R}$S=(1+s$_y$)+min(fw, mw+$2^{ew-1}$−2).

A binary logic circuit may not necessarily have both exception-detection circuitry and a corrector unit: the circuit may for example have a corrector unit and/or exception-detection circuitry. It may have neither component. The formatting units may be included within the binary logic circuit (as shown in the examples herein), but in other examples the binary logic circuit may not include formatting units. In such cases the binary logic circuit may be configured to receive appropriately formatted significands directly. Those inputs could be input directly into the left and right shifters.

The binary logic circuits described above may offer performance advantages over conventional floating-point-to-fixed-point conversion circuits. For example, for unsigned numbers, the mantissa may be subject to little or no computational logic (e.g. negation) before being shifted. In this case, the performance of conventional conversion circuits may be limited by the delay in subtracting the bias from the exponent to determine the significand shift. The circuits described above remove this subtraction by determining the significand shift from the exponent, and therefore overcome this performance limitation.

Another situation for which the binary logic circuits may be particularly well suited is for converting a signed number to fixed point format with a round-to-zero (RTZ) rounding mode. For RTZ rounding mode, it is preferable that the negation of the significand is performed after the significand has been shifted in order to produce the correctly rounded result. Thus although the number may be signed, there may be little or no computational logic in the path of the significand before the shifter, and thus avoiding the subtraction of the bias from the exponent may offer improved circuit performance compared to conventional conversion circuits.

Single-Path Shifter

Figure 7:
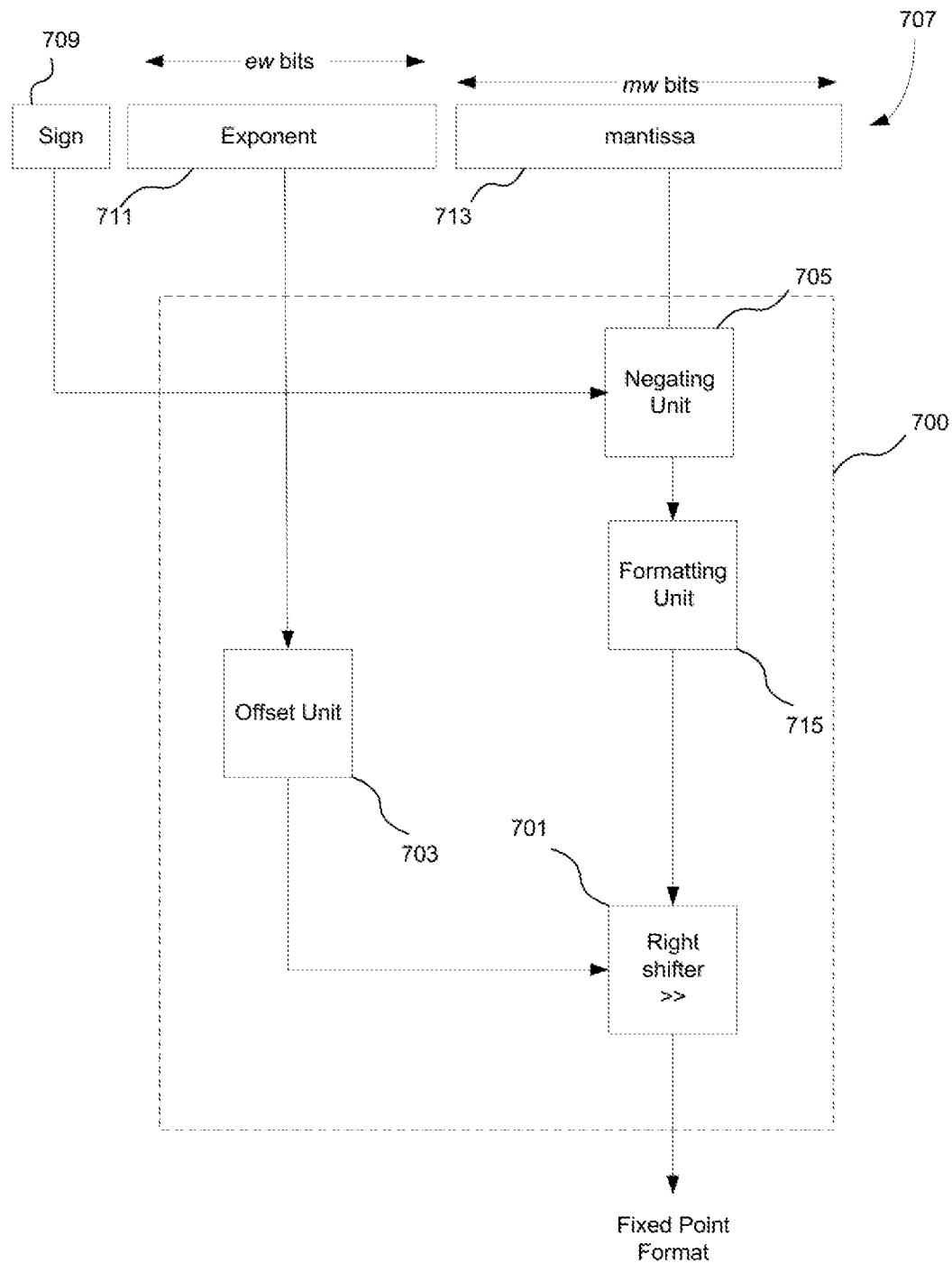
FIG. 7 shows an example of a single-shifter binary logic circuit for converting a floating point number to a fixed point number.

FIG. 7 shows a further example of a binary logic circuit 700 for converting a binary number in floating point format to fixed point format.

The binary logic circuit comprises a right-shifter 701, a formatting unit 715, an offset unit 703 and a negating unit 705. The shifter 701 is coupled to the offset unit 703 and the formatting unit 715. The shifter has a width denoted width$_{RS}$. The formatting unit is coupled to the negating unit. The floating point number to be converted is shown schematically at 707 and comprises a sign bit S 709, an exponent field 711 of ew bits representing the exponent E and a mantissa field 713 of mw bits representing the mantissa M. The exponent is biased by an exponent bias B, given in this example by B=$2^{ew-1}$−1. The true exponent of the floating point number is given by (E−B). The floating point number therefore represents the value given by $(-1)^{sign} \times 2^{E-B} \times$ significand$=(-1)^{sign} \times 2^{E-B} \times Y.M$, where Y is the leading bit of the significand, M is the mantissa, and Y=1 for a normal floating point number and Y=0 for a denormal floating point number. The fixed point format has an integer part of iw bits and a fractional part of fw bits such that the number in fixed point format is given by iw.fw, with iw and fw being separated by a radix point.

The negating unit 705 is configured to receive the mantissa M and to add the implicit high bit Y to form the significand. In an alternative example the negating unit may receive both the mantissa and the high bit. The negating unit is further configured to receive the sign bit 709 and to negate the significand in dependence on the value of the sign bit. The negating unit is further configured to append the sign bit to the leading edge of the significand to generate a signed output in the form SY.M, where SY are the bits before the radix point and represent the two-most significant bits of the number: the sign bit S and the implicit bit Y of the mantissa. Thus, the signed output comprises the sign bit appended to the leading bit of the significand. The signed output may be a bit-string comprising only the sign bit and significand bits.

The negating unit may negate the significand by taking the complement of the significand. In this example, the negating unit is configured to negate the significand if the sign bit has a value of '1', and to not negate the significand if the sign bit has a value of '0'. The output of the negating unit is fed as an input to the formatting unit 715.

The formatting unit 715 is configured to receive the signed significand and to perform one or more formatting operations. The formatting operations may include, for example, re-sizing the significand to produce a bit string with a number of bits suitable for use with the right-shifter 701. The significand may be re-sized to a number of bits equal to the bit width of the shifter width$_{RS'}$, for example. The re-sizing operations may include appending one or more zero bits to the least significant bit of the mantissa (e.g. if the value (1+$s_y$+mw) is less than the bit width of the shifter 701), or truncating one or more of the least significant bits of the mantissa (e.g. if the value (1+$s_y$+mw) is greater than the bit width of the shifter 701). In particular, if (1+$s_y$+mw) >width$_{RS'}$, then the formatting unit may truncate the [(1+$s_y$+mw)−width$_{RS'}$] least significant bits of the significand; if (1+$s_y$+mw)<width$_{RS'}$, the formatting unit may append [width$_{RS'}$−(1+$s_y$+mw)] zero bits to the trailing edge of the significand.

The right shifter 701 therefore receives as its input a formatted set of the significand bits. The significand bits may have been formatted in the sense that a sign bit has been appended to the most significant bit, and/or that the significand has been re-sized. Alternatively or in addition, the bits may be formatted in the sense that they have been negated in dependence on the value of the sign bit. The formatted set of bits may comprise all the bits of the significand (e.g. if no bits are truncated), or alternatively it may comprise only a subset of contiguous bits including the most significant bits (e.g. if a number of least significant bits are truncated during re-sizing). The most significant bits may include the sign bit and the implicit leading bit Y.

The formatted set of bits form the input to the right-shifter 701, which may be referred to as a significand input. The input is then shifted by the shifter to transform the number to fixed point format given by iw.fw.

The offset unit 703 is configured to offset the exponent E of the floating point number to generate a shift value $s_v$ used by the shifter 701 to shift the signed number. The offset unit 703 outputs the shift value $s_v$ to the shifter 701. The shift value is a value represented by sw bits. By offsetting the exponent in a suitable manner, the binary logic circuit is capable of converting floating point numbers to fixed point format for both positive and negative values of the true exponent (E−B) using a single shifter capable of shifting in a single direction only.

In this example, the offset unit is configured to receive the exponent E and to offset the exponent E by a value equal to the maximum amount by which the mantissa (or equally, the signed number SY.M) can be left-shifted before overflow occurs in the fixed point format (i.e. before the most significant bit of the number is shifted out of the result). In this example, because the number is signed, the offset unit offsets the exponent E by the value (iw−2) to generate the shift value. If the number were unsigned, the offset unit may offset the exponent by the value (iw−1). Thus, in general the offset unit may be offset the exponent by the value (iw−1−$s_y$), where $s_y$=1 for a signed number and $s_y$=0 for an unsigned number.

Figure 8:
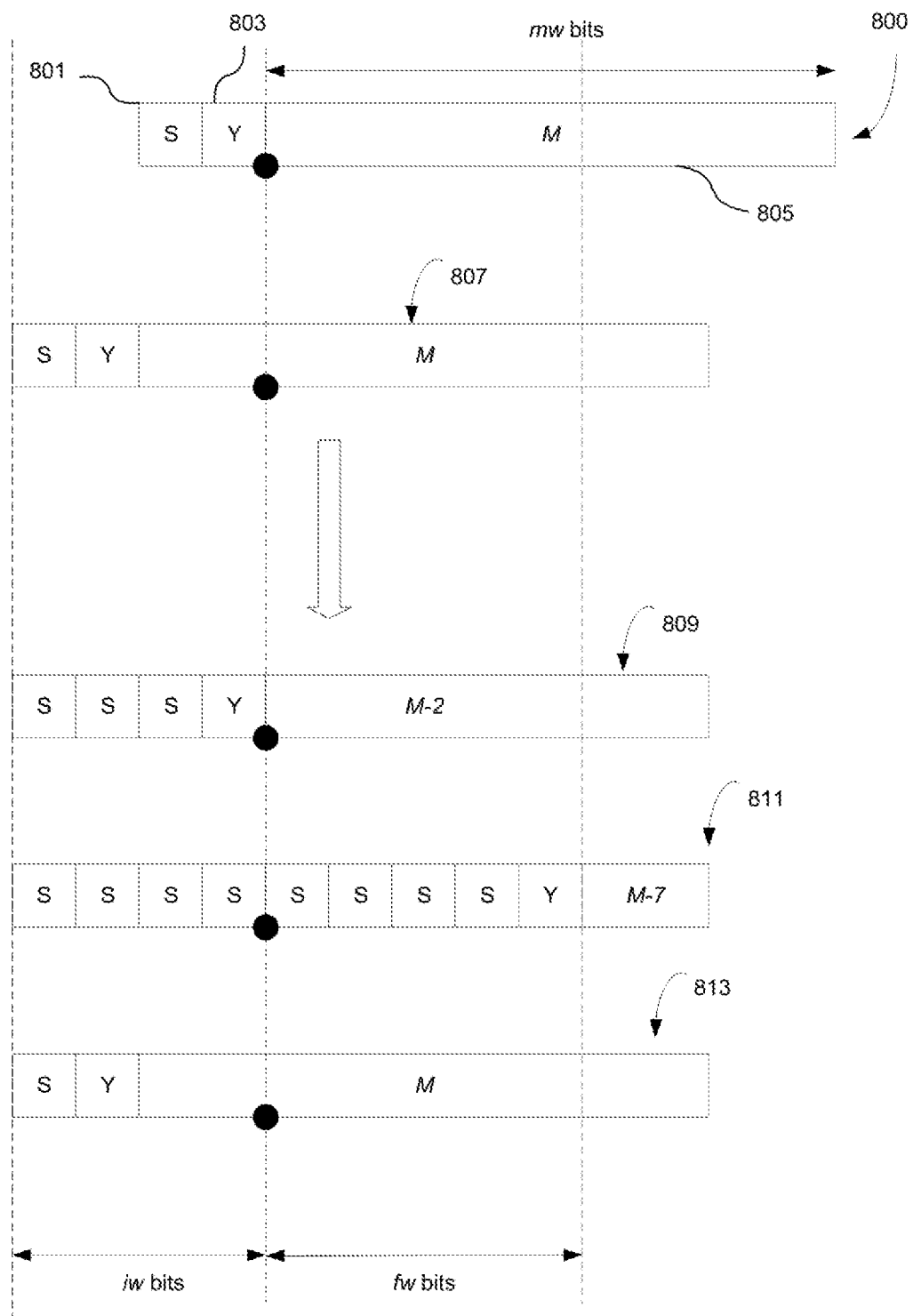
FIG. 8 shows a schematic illustration of how the single shifter of FIG. 7 can shift a significand to convert the number from floating point to fixed point format.

The offset unit offsets the exponent to generate the shift value $s_v=((B-E)+(iw-1-s_y))$. The shifter 701 is then configured to right-shift the signed number by a number of bits equal to the value $s_v$ to generate a shifted result, and to shift in $s_v$ sign bits. That is, the shifter 701 replicates the sign bit S to fill the vacant positions introduced by each right shift. Configuring the shifter in this way enables a number in floating point format to be converted to fixed point format for both positive and negative values of the true exponent (E−B). To demonstrate this, various examples for shifting a signed number will now be described with reference to FIG. 8.

In these examples the formatted significand is in the form of a signed number SY.M. That is, in this example for the purposes of clarity the significand has not also been re-sized.

The signed number SY.M is shown at 800 and comprises the sign bit 801, implicit leading bit Y of the significand 803, and the mw bits of the mantissa M 805. The number 800 is to be interpreted such that the leading bit of the significand Y and fractional bits M are separated by the radix point. The number is shown with the radix point aligned with the radix point separating the integer and fractional parts of the fixed point format, where in this example iw=4 bits and fw=5 bits. The signed number re-interpreted as a number in the form iw.(mw−iw+1+$s_y$) is shown at 807. Number 807 is to be interpreted such that the leading iw bits and the trailing (mw−(iw−1−$s_y$)) bits are separated by a radix point. Note that the bits forming the number 807 are identical to those representing the number 800—it is what those bits represent that is taken to be different for the purposes of illustration.

Now, as a first example, consider the case in which the value of the true exponent is equal to 0, so the floating point number represents the value $(-1)^{sign} \times Y.M$. It follows the value of $s_v$=iw−2=2. Thus, if the true exponent is equal to 0, the right-shifter shifts the signed number to the right by 2 bits to generate the shifted result shown at 809. Because in this example the input number 800 is signed, the right shifter shifts in $s_v$ sign bits (in this example, two sign bits). The two least significant bits of the mantissa have been shifted out of the result 809. Of course, the number of bits shifted out of the result depends on the shifter width, which has been chosen to be equal to (iw+fw+2) in these examples merely for illustration. It can be seen that the leading bit of the significand Y and the mw−2 remaining fractional bits of the mantissa are separated by the radix point when interpreted in the fixed point format iw.fw, and thus the shifter 701 has given the correct result.

As another example, if the value of the true exponent (E−B) is equal to −fw (so that the leading bit Y of the significand is the least significant bit of the shifted number in iw.fw format), the value of $s_v=((B-E)+(iw-1-1))=(fw+iw-2)=7$. That is, if the value of the true exponent is equal to −fw, the shifter 701 shifts the signed number 801 to the right by (fw+iw−2) bits to generate the shifted result shown at 811. It can be seen that leading bit Y of the significand is the least significant bit of the result in fixed point format, and thus the shifter 701 has again given the correct result. The seven least significant bits of the mantissa have been shifted out of the result in this example, and the right-shifter has shifted in 7 sign bits.

For a final example, consider the case where the value of the true exponent is equal to iw−2 (so that the sign bit 801 is the most significant bit of the shifted number in fixed point format). In this case, the value of $s_v=0$ and so the shifter 701 doesn't shift the signed number 801 and thus the most significant bit of the signed number (i.e. the sign bit) is also the most significant bit of the shifted result 813.

Offsetting the exponent bias by a value equal to the maximum left-shift before overflow occurs may be viewed conceptually as left-aligning the formatted significand (e.g. the signed number SY.M) with the fixed point format (i.e. aligning the sign bit, or most significant bit, of the number with the most significant bit of the fixed point format).

The shifted result output from the shifter 701 may be taken as the fixed point number.

The shifter 701 may be optimised by exploiting knowledge of the floating point and fixed point formats.

The shifter 701 may be optimised by limiting its shift range. It will be appreciated from FIG. 8 that the maximum value the shifter 701 can shift to the right by before underflow occurs (i.e. before the leading bit of the mantissa is shifted out of the result) is $(iw+fw-1-s_v)$ bits. In certain cases however the maximum amount the shifter 701 will need to shift right by will be limited by the exponent, not the size of the fixed point format. More specifically, the maximum amount by which the significand can be left-shifted in accordance with the exponent is when $E=2^{ew}-2$ ($E=2^{ew}-1$ being an exception result), giving a maximum left-shift of $(E-B)_{max}=2^{ew}-2-(2^{ew-1}-1)=2^{ew-1}-1=B$. Thus when $2^{ew-1}-1\leq(iw-1-s_v)$, overflow cannot occur. Conversely, when $2^{ew-1}-1>(iw-1-s_v)$, the exponent is capable of taking values that cause overflow and thus the maximum left shift is limited to $(iw-1-s_v)$. The maximum left-shift is therefore equal to the minimum of: i) $2^{ew-1}-1$ and ii) $(iw-1-s_v)$.

The maximum right shift before overflow occurs is equal to the fractional width, fw.

The maximum right-shift governed by the exponent occurs when E=1 (E=0 being an exception), giving a right-shift of $2^{ew-1}-2$ (=B−1). The maximum right-shift is therefore equal to the minimum of: i) fw and ii) $2^{ew-1}-2$.

Thus, the total shift range of the shifter 701 can be minimised to: $\min(2^{ew-1}-1, iw-1-s_v)+\min(fw, 2^{ew-1}-2)$. This is advantageous because reducing the range of the shifter may improve its speed by reducing the number of required multiplexers, as described above.

It follows that if the shift range of shifter 701 can be optimised, the shifter 701 need only inspect the k' least significant bits of the shift value $s_v$, where k'=bitwidth[min$(2^{ew-1}-1, iw-1-s_v)+\min(fw, 2^{ew-1}-2)$]. Inspecting these k' least significant bits ensures that the minimum number of bits of the shift value $s_v$ are inspected in order to cover the shift range of the shifter 701.

Of course, in some examples k' may be equal to the bit width of $s_v$ regardless of the floating point and fixed point formats. In this case, values of the shift value $s_v$ which would cause overflow to occur would be handled as exceptions by exception-handling circuitry.

Thus, in general bitwidth[$\min(2^{ew-1}-1, iw-1-s_v)+\min(fw, 2^{ew-1}-2)$]≤k'≤sw.

It also follows that if the range of the shifter 701 is optimised, the bit width of the shifter, width$_{RS'}$, may also be optimised. It can be seen with reference to FIG. 8 that if mw>$(iw+fw-(1+s_v))$, then the width of the shifter is optimised by setting it equal to iw+fw. If on the other hand mw≤$(iw+fw-(1+s_v))$, the minimum width of the shifter is equal to $(1+s_v+mw)$ plus the minimum shift range of the shifter if the total width is smaller than iw+fw, i.e. width$_{RS}'=(1+s_v+mw)+\min(2^{ew-1}-1, iw-1-s_v)+\min(fw, 2^{ew-1}-2)$. Thus in general, the bit width of the shifter 701 can be minimised as: width$_{RS}$=$\min[(iw+fw), (1+s_v+mw)+\min(2^{ew-1}-1, iw-1-s_v)+\min(fw, 2^{ew-1}-2)]$.

Figure 9:
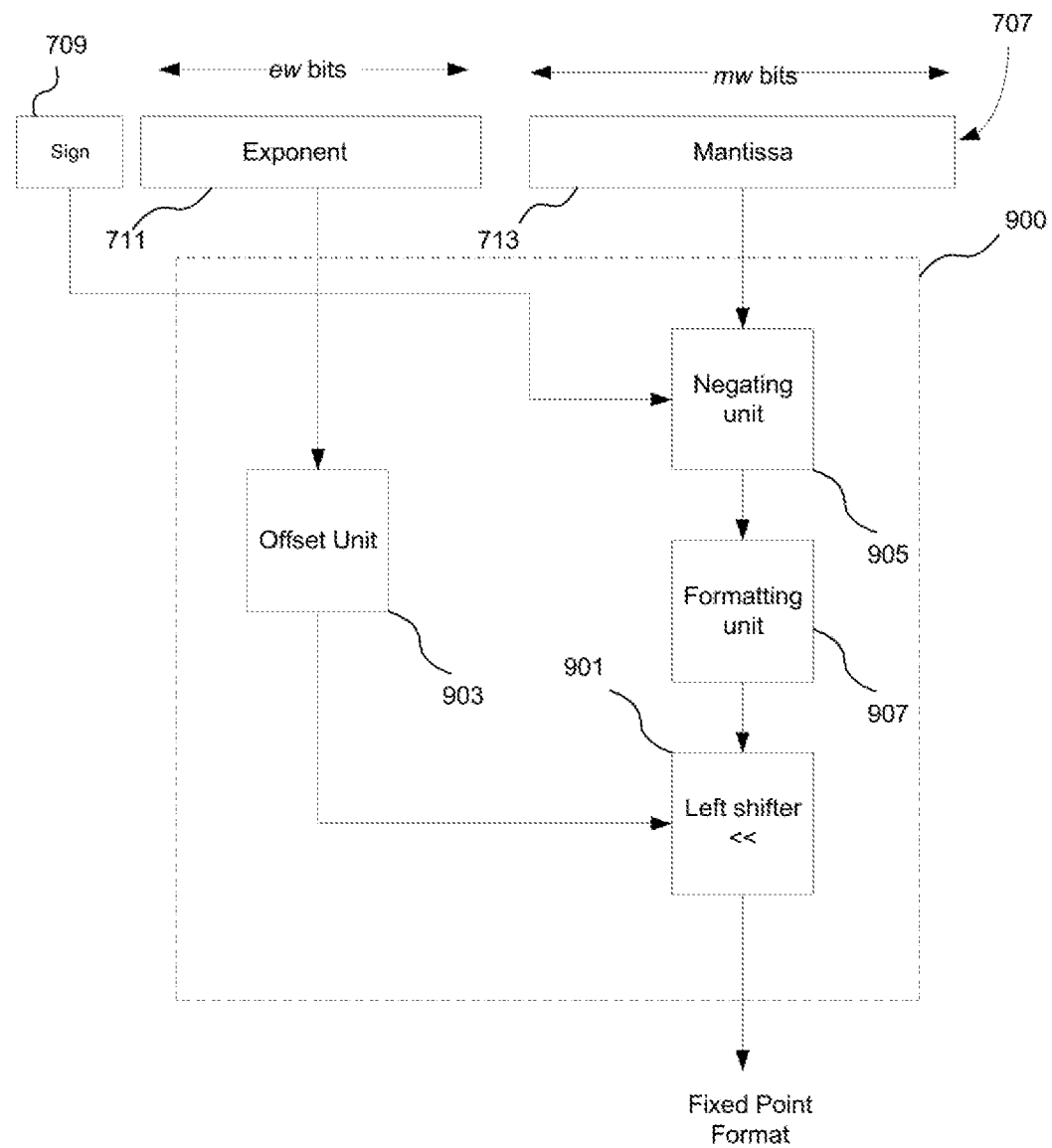
FIG. 9 shows a further example of a single-shifter binary logic circuit for converting a floating point number to a fixed point number.

An alternative example of a single-shifter binary logic circuit is shown in FIG. 9. In this example the binary logic circuit comprises a single shifter configured to shift to the left only.

As shown in FIG. 9, the binary logic circuit 900 comprises a left-shifter 901, an offset unit 903, a negating unit 905 and a formatting unit 907. The shifter 901 is coupled to the offset unit 903 and the formatting unit 907, and has a bitwidth denoted width$_{LS'}$. The negating unit 905 is coupled to the formatting unit 907.

The floating point number is shown schematically at 707 and again represents the value given by $(-1)^{sign}\times 2^{E-B}\times$ significand=$(-1)^{sign}\times 2^{E-B}\times Y.M$, where Y is the leading bit of the significand, M is the mantissa, and Y=1 for a normal floating point number and Y=0 for a denormal floating point number. The fixed point number to which the floating point number is to be converted comprises an integer part of iw bits and a fractional part of fw bits.

The offset unit 903 is configured to offset the exponent E of the floating point number to generate a shift value $s_v$ used by the shifter 901 to left-shift the signed number. The offset unit outputs the shift value to the shifter 901. By suitably offsetting the exponent bias B, the binary logic circuit 900 is capable of converting floating point numbers to fixed point numbers for both positive and negative values of the true exponent (E−B) using a single shifter capable to shifting to the left only.

The offset unit 903 is configured to receive the exponent E and to offset it by a value equal to the maximum amount by which the formatted significand (e.g. signed number SY.M) can be shifted to the right before underflow occurs. In this case the offset unit is configured to offset the exponent E by fw to generate a shift value given by $s_v=(E-B+fw)$. The value $s_v$ is then input to the shifter 901. The shift value $s_v$ has a bit width of sw bits.

The negating unit 905 is configured to receive the mantissa M and the sign bit 709. The negating unit may additionally receive the implicit high bit of the significand or it may internally append this to the leading edge of the mantissa to form the significand. The negating unit may further be configured to append the sign bit to the leading edge of the significand to generate a signed output in the form SY.M. The negating unit takes the complement of the significand in dependence on the value of the sign bit 709. In this example, the negating unit is configured to negate the significand if the sign bit has a value of '1', and to not negate the significand if the sign bit has a value of '0'. The signed output comprises a sign bit appended to the leading bit of the significand. The signed output may be a bit string comprising only the sign bit and the significand. The signed output is fed as an input to the formatting unit 907.

Figure 10:
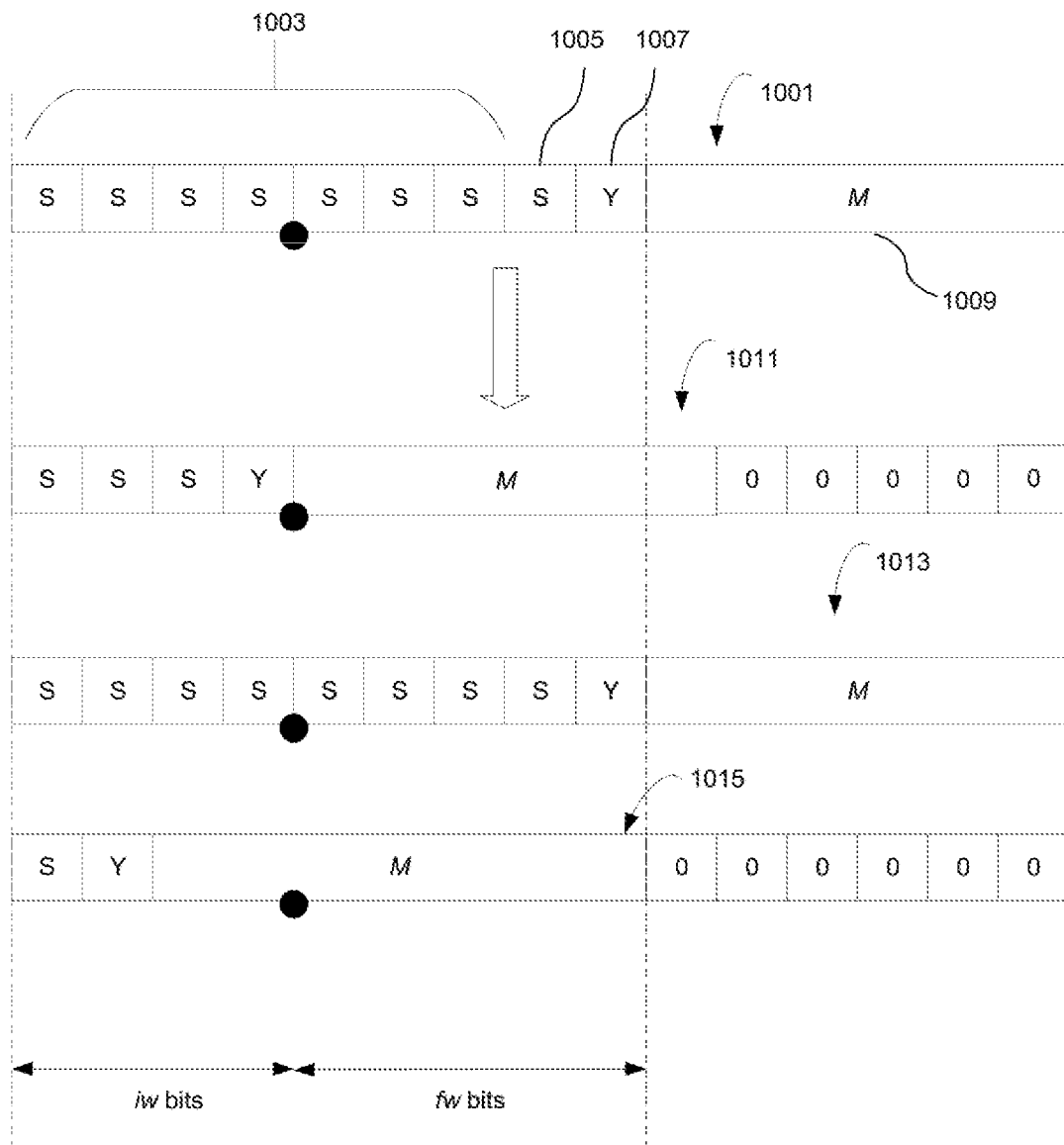
FIG. 10 shows a schematic illustration of how the single shifter of FIG. 9 can shift a significand to convert the number from floating point to fixed point format

The formatting unit 907 is configured to receive the signed output SY.M and to perform one or more formatting operations. The formatting unit is configured to append (iw+fw−(1+$s_y$)) sign bits to the most significant bit of the signed number SY.M (where $s_y$=1 because the input number 707 is signed). This effectively right-aligns the significand to the fixed point format, i.e. the leading bit (the implicit high bit Y) of the significand is aligned with the least significant bit of the fixed point format. In other words, in the formatted significand, the leading bit of the significand is the fw$^{th}$ most significant bit. An example of a formatted signed number SY.M is shown in FIG. 10 at 1001. The formatting operations may further comprise re-sizing the significand to produce a bit string with a number of bits suitable for use with the left-shifter 901. The significand may be re-sized to a number of bits equal to the bit width of the shifter, for example. In particular, if (iw+fw+mw)>width$_{LS}$, then the formatting unit may truncate the [(iw+fw+mw)−width$_{RS}$] least significant bits of the significand. Alternatively, if width$_{LS}$>(iw+fw+mw), the formatting unit may append [width$_{LS}$−(iw+fw+mw)] zero bits to the trailing edge of the significand.

The left shifter therefore receives as its input a formatted set of the significand bits. The significand bits may have been formatted in the sense that (iw+fw−(1+$s_y$)) sign bits have been appended to the most significant bit, and/or that the mantissa has been re-sized. Alternatively, or in addition, the bits may be formatted in the sense that complement of these bits has been taken in accordance with the value of the sign bit. The formatted set of bits may comprise all the bits of the signed number SY.M (e.g. if no bits are truncated), or alternatively it may comprise only a subset of contiguous bits including the most significant bits (e.g. if a number of least significant bits are truncated during re-sizing). The most significant bits may include the sign bit and the leading bit Y.

The shifter 901 is configured to shift to the left only. It is configured to receive as an input the formatted set of bits output from the formatting unit 907 and the shift value $s_v$ from the offset unit 903. The shifter is configured to left-shift the signed number by a number of bits equal to $s_v$=(E−B+fw). Configuring the left-shifter in this manner allows a number to be converted to fixed point format for positive and negative values of the true exponent (E−B) using a single shifter. To illustrate this, a number of examples will now be described with reference to FIG. 10, in which again iw=4 and fw=5.

An example of a formatted significand received by the left-shifter 901 is shown at 1001. It comprises the leading (iw+fw−(1+$s_y$)) appended sign bits, denoted 1003, the sign bit S, denoted 1005, the implicit leading bit Y, denoted 1007, and the fractional mantissa bits M, denoted 1009. The integer and fractional widths of the fixed point number are also shown for illustrative purposes. In this example the mantissa has not been re-sized by truncating, or appending zero bits to, its least significant bits.

Consider a first example in which the value of the true exponent is equal to 0, so that the floating point number represents the value $(-1)^{sign} \times 2^0 \times$Y.M and the value of $s_v$=$s_v$=(E−B+fw)=fw. The left-shifter 901 is configured to left-shift the number 1001 to the left by fw bits to generate the shifted result 1011. It can be seen that the shifted result is correctly aligned with respect to the fixed point format, i.e. the sign bit and leading significand bit form the integer part of the fixed point number, and the M mantissa bits form the fractional part of the fixed point number. Interpreted as a fixed point number in the format Siw.fw, the shifted result 1011 represents the numerical value Y.M (excluding the sign bit). The binary logic circuit 900 has therefore provided the correct result. Shifter 901 outputs the shifted result 1011.

Consider a second example in which the value of the true exponent is equal to −fw, so that the value of $s_v$=0. In this case the left-shifter 901 shifts the signed number to the left by 0 bits (i.e. the signed number is not shifted) to generate the result 1013, which is output from the shifter 901. Thus in this case the most significant bit of the significand (the implicit leading bit Y) corresponds to the least significant bit of the fixed point number in Siw.fw format. Result 1013 represents the minimum value of the fixed point number before the leading significand bit is shifted out of the fixed point result and underflow occurs.

For the third example consider the case where the true exponent is equal to (iw−2) so that the floating point number represents the value $(-1)^{sign} \times 2^{iw-2} \times$Y.M. The shift value generated by the offset unit is therefore given by $s_v$=iw+fw−2. Thus in this case the left-shifter 901 left-shifts the formatted significand 1001 by (iw+fw−2) bits to generate the shifted result 1015. Result 1015 is then output from the shifter 901. In this case the most significant bit of the significand 1001 (the sign bit) corresponds to the most significant bit of the fixed point result in iw.fw format. Result 1015 therefore represents the maximum value of the fixed point number before the sign bit is shifted out of the result and overflow occurs.

Offsetting the exponent bias by the fractional width fw may be viewed conceptually as right-aligning the significand with the fixed point format so that the leading bit of the significand is aligned with the least significant bit of the fixed point format.

Similarly to the single shifter circuit shown in FIG. 7, the shifter 901 may be optimised by exploiting knowledge of the floating point and fixed point formats. One way in which the shifter may be optimised is to minimise the shift range. The shift range may be optimised in the same manner as shifter 701 described above. In particular, it has been appreciated that the optimised range of the shifter 901 is equal to the maximum upshift (limited either by the exponent width ew or integer width iw) plus the maximum downshift (limited either by the exponent width ew or fractional width fw). The optimised shift range of the shifter 901 is thus the same as the optimised shift range of the shifter 701 and is equal to: min($2^{ew-1}$−1, iw−1−$s_y$)+min(fw, $2^{ew-1}$−2).

It follows that if the shift range of the shifter 901 can be optimised, the shifter 901 need not necessarily inspect all sw bits of the shift value $s_v$, but only the k" least significant bits, where k"=bitwidth[min($2^{ew-1}$−1, iw−1−$s_y$)+min(fw, $2^{ew-1}$−2)]. Inspecting these k" least significant bits ensures that the minimum number of bits of the shift value $s_v$ are inspected in order to cover the shift range of the shifter 901. The (sw−k") most significant bits of the shift value need not be inspected because if any of those bits were non-zero, the shift value would cause overflow to occur (and so be handled as an exception result).

Of course, the value of k" may be set equal to the bit width of the shift value $s_v$ regardless of the floating point and fixed point formats. In this case, values of the shift value $s_v$ which would cause overflow to occur would be handled as exceptions by exception-handling circuitry.

Thus, in general, bitwidth[min($2^{ew-1}$−1, iw−1−$s_y$)+min (fw, $2^{ew-1}$−2)]≤k"≤sw.

Knowledge of the optimised shift range can also be exploited to minimise the size of the shifter 901 (i.e. its bitwidth). The bitwidth of the shifter 901, denoted width$_{LS}$, can be minimised by setting it equal to the range of the output number in fixed point format plus the minimum shift range. The optimised width of the shifter is thus width$_{LS}$'=iw+fw+min($2^{ew-1}$−1, iw−1−s$_y$)+min(fw, $2^{ew-1}$−2). Optimising the bitwidth of shifter 901 advantageously allows the hardware requirements of the shifter to be reduced.

The above examples described with reference to FIGS. 7 to 10 serve to illustrate how a binary logic circuit can be configured to convert a number in floating point format to fixed point format using only a single shifter. Although not shown, the binary logic circuits 700 and 900 may further comprise a rounding module configured to round the result output from the shifters. The rounding modules may be configured to round the output from the shifters to fw fractional bits. The rounding modules may be configured to implement one of the following rounding modes: round-to-zero; round-to-nearest-even; round-to-negative-infinity; round-to-positive infinity.

Binary logic circuits 700 and 900 may also further comprise exception-handling circuitry (e.g. exception detection circuitry 503). That exception handling circuitry may be configured to detect one or both of an overflow condition and an underflow condition, as described above for circuitry 503. The circuits 700, 900 may additionally comprise a multiplexer (e.g. output multiplexer 505) that multiplexes between an exception result output from the exception-handling circuitry and the result output from the shifter.

Binary logic circuits 700 and 900 have been described as including a negating unit that outputs a result to a formatting unit. In an alternative arrangement, the negating unit may be arranged downstream of the formatting unit so that the formatting unit outputs a result to the negating unit, with the negating unit then generating the input to the shifter. Alternatively still, the negating unit could be arranged downstream of the shifter, so that the output of the shifter is input into the negating unit. The circuits have also been described as operating on signed numbers. The circuits 700 and 900 could be adapted to work on unsigned numbers. In this case, the circuits need not comprise the negating units 705 and 907. Furthermore, for unsigned numbers the formatting unit 905 may append (iw+fw−1) zero bits to the leading bit of the significand. Thus, in general, the formatting unit 905 appends (iw+fw−(1+s$_y$)) bits to the leading bit of the significand, where s$_y$=1 and the appended bits are sign bits for signed floating point numbers, and s$_y$=0 and the appended bits are zero bits for unsigned floating point numbers.

The single-shifter circuits described above with reference to FIGS. 7 to 10 may offer performance advantages over conventional floating-point-to-fixed-point conversion circuits. For example, by utilising a single shifter configured to shift in a single direction only, the need to negate the shift (e.g. if the true exponent is negative) is avoided. Furthermore, for some floating point and fixed point formats, the delay of the single shifter is less than the delay associated with that of split-path shifters and the associated multiplexer. This may offer performance advantages when the number to be converted to fixed point format is signed. This is explained in more detail below.

The delay associated with a shifter is related to its bit depth, i.e. the bit width of its shift range. The bit depth of the right-shifter 701 and left-shifter 901 is bitwidth[min($2^{ew-1}$−1, iw−1−s$_y$)+min(fw, $2^{ew-1}$−2)]=ceil{log$_2$[1+min($2^{ew-1}$−1, iw−1−s$_y$)+min(fw, $2^{ew-1}$−2)]}. For a split-path shifter, the left-shifter has a bit depth of ceil[log$_2$(1+(iw−1−s$_y$))]=ceil[log$_2$(iw−s$_y$)], and the right shifter a depth of ceil[log$_2$(1+(1+fw))]=ceil[log$_2$(2+fw)]. The total delay of the split-path circuit is equal to the larger of the shifter delays plus the delay of the multiplexer, which may typically be about the same as the larger of the shifter delays. For example, if iw=7 and fw=16 and the number is unsigned (i.e. s$_y$=0), the depth of the single shifter is ceil[log$_2$(1+(7−1)+16)]=ceil[log$_2$ 23]=5, while for the split-path circuit the depths of the left and right shifters are ceil[log$_2$(1+(7−1))]=3 and ceil[log$_2$(1+(1+16))]=5 respectively. Thus, the right-shifter of the split-path circuit has the same delay as the single shifter, but the split-path circuit has an additional multiplexer as well. For the conversion of signed numbers with a RTN rounding mode, the mantissa is preferably negated prior to be being shifted to ensure maximum accuracy in the rounded result. In this case, the negation of the mantissa may limit the speed of the conversion of the number to fixed point format. This provides time to compute the shift offset, and because the single shifter is typically smaller than the total size of the split-path shifters, the single shifter circuit may reduce the hardware requirements in these cases.

Example circuits have been described herein for converting a binary number in floating point format to fixed point format. In these examples, specific values have been assigned to the floating point and fixed point formats (integer width, fractional width etc.). It will be appreciated that this was for the purpose of illustration only, and that the circuits described herein are capable of converting numbers of various floating point formats to various fixed point formats. The floating point format may for example be 32-bit single precision, or 64-bit double precision in accordance with the IEEE 754 standard. The numbers (in floating point and/or fixed point format) may be signed or unsigned.

The examples described herein illustrate how the significand may be formatted prior to being shifted. The formatting may be performed by a formatting unit forming part of the binary logic circuit (as in some of the examples described herein), but it will be appreciated that the formatting may be performed by one or more components separate to the binary logic circuit. In such cases the (formatted) mantissa/significand inputs to the binary logic circuit may be received directly by the shifters.

The examples described herein use the terminology 'left-shift' and 'right-shift'. These terms have been used to denote a direction in which a binary string is shifted by a shifter. These terms have been used within the context of a conventional binary logic system in which a binary string is read left to right; i.e. the most significant bits of the string are left-most bits, and the least significant bits of the string are the right-most bits. It will be appreciated that the term 'left-shift' has been used to denote that the input is shifted in a direction towards the most significant bit, and the term 'right-shift' has been used to denote that an input that is shifted in a direction towards the least significant bit.

The logic circuits of FIGS. 4-10 are shown as comprising a number of functional blocks. This is schematic only and is not intended to define a strict division between different logic elements of such entities. Each functional block may be provided in any suitable manner. It is to be understood that intermediate values described herein as being formed by a unit, or shifter need not be physically generated by the unit or shifter at any point and may merely represent logical values which conveniently describe the processing performed by the unit or shifter between its input and output.

Generally, any of the functions, methods, techniques or components described above can be implemented in software, firmware, hardware (e.g., fixed logic circuitry), or any combination thereof. The terms "module," "functionality,"

"component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be any kind of general purpose or dedicated processor, such as a CPU, GPU, System-on-chip, state machine, media processor, an application-specific integrated circuit (ASIC), a programmable logic array, a field-programmable gate array (FPGA), or the like. A computer or computer system may comprise one or more processors.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed in an integrated circuit manufacturing system configures the system to manufacture a binary logic circuit configured to perform any of the methods described herein, or to manufacture a binary logic circuit comprising any apparatus described herein.

An integrated circuit definition dataset may be in the form of computer code, for example as a netlist, code for configuring a programmable chip, as a hardware description language defining an integrated circuit at any level, including as register transfer level (RTL) code, as high-level circuit representations such as Verilog or VHDL, and as low-level circuit representations such as OASIS and GDSII. Higher level representations which logically define an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture a binary logic circuit will now be described with respect to FIG. 11.

Figure 11:
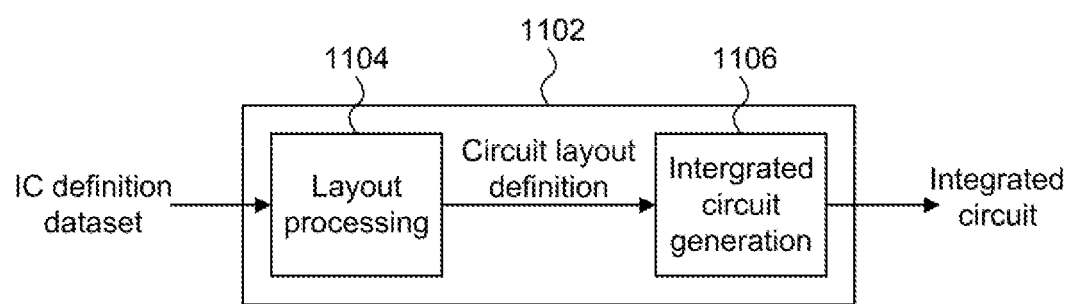
FIG. 11 shows an example integrated circuit manufacturing system for processing an integrated circuit definition dataset and manufacturing a binary logic circuit.

FIG. 11 shows an example of an integrated circuit (IC) manufacturing system 1102 which comprises a layout processing system 1104 and an integrated circuit generation system 1106. The IC manufacturing system 1102 is configured to receive an IC definition dataset (e.g. defining a logic circuit as described in any of the examples herein), process the IC definition dataset, and generate an IC according to the IC definition dataset (e.g. which embodies a binary logic circuit as described in any of the examples herein). The processing of the IC definition dataset configures the IC manufacturing system 1102 to manufacture an integrated circuit embodying a binary logic circuit as described in any of the examples herein.

The layout processing system 1104 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 1104 has determined the circuit layout it may output a circuit layout definition to the IC generation system 1106.

The IC generation system 1106 generates an IC according to the circuit layout definition, as is known in the art. For example, the IC generation system 1106 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 1106 may be in the form of computer-readable code which the IC generation system 1106 can use to form a suitable mask for use in generating an IC.

The different processes performed by the IC manufacturing system 1102 may be implemented all in one location, e.g. by one party. Alternatively, the IC manufacturing system 1102 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture a binary logic circuit without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 11 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 11, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

What is claimed is:

1. A binary logic circuit for converting a number in floating point format having an exponent E of ew bits, an exponent bias B given by $B=2^{ew-1}-1$, and a significand comprising a mantissa M of mw bits into a fixed point format with an integer width of iw bits and a fractional width of fw bits, the binary logic circuit comprising:
a first shifter operable to receive a first significand input comprising a contiguous set of the most significant bits of the significand and configured to left-shift the first significand input by a number of bits equal to the value represented by k least significant bits of the exponent to generate a first output, wherein $\min\{(ew-1), \text{bitwidth}(iw-2-s_y)\} \le k \le (ew-1)$ where $s_y=1$ for a signed floating point number and $s_y=0$ for an unsigned floating point number;
an inverting hardware circuit configured to invert the bit values of the exponent;
a second shifter coupled to the inverting hardware circuit configured to receive a second significand input comprising a contiguous set of the most significant bits of the significand and configured to right-shift the second significand input by a number of bits equal to the value represented by the p least significant bits of the inverted exponent to generate a second output, wherein $\min\{(ew-1), \text{bitwidth}(fw)\} \le p \le (ew-1)$; and
a multiplexer coupled to the first and second shifters and configured to: receive a first input comprising a contiguous set of bits of the first output and a second input comprising a contiguous set of bits of the second output; and output the first input if the most significant bit of the exponent is equal to one; and output the second input if the most significant bit of the exponent is equal to zero.

2. A binary logic circuit as claimed in claim 1, wherein the binary logic circuit further comprises a first formatting hardware circuit coupled to the first shifter, the first formatting hardware circuit configured to receive as an input a string comprising the mw mantissa bits and to format the string to generate the first significand input to the first shifter.

3. A binary logic circuit as claimed in claim 2, wherein the first formatting hardware circuit is configured to perform one or more formatting operations comprising appending $(iw-2-s_y)$ bits to the most significant bit of the significand, where $s_y=0$ and the appended bits are zero bits for an unsigned floating point number, and $s_y=1$ and the appended bits are sign bits for a signed floating point number.

4. A binary logic circuit as claimed in claim 1, wherein the first input of the multiplexer is equal to the first output.

5. A binary logic circuit as claimed in claim 1, wherein the first shifter has a bit width equal to $iw''+\min(mw,(fw+iw''))$, where $iw''=\min\{(iw-2-s_y), 2^{ew-1}-2\}$.

6. A binary logic circuit as claimed in claim 2, wherein the first formatting hardware circuit is configured to perform one or more formatting operations comprising appending $(iw-1-s_y)$ bits to the most significant bit of the significand, where $s_y=0$ and the appended bits are zero bits for an unsigned floating point number, and $s_y=1$ and the appended bits are sign bits for a signed floating point number.

7. A binary logic circuit as claimed in claim 1, further comprising a correction hardware circuit coupled to the first shifter and the multiplexer, the correction hardware circuit being configured to receive the first output and to discard its most significant bit and append a zero-bit to its least significant bit to form the first input to the multiplexer.

8. A binary logic circuit as claimed in claim 1, wherein the first shifter has a bit width equal to $iw'+\min(mw, (fw+iw'))$, where $iw'=\min\{(iw-1-s_y), 2^{ew-1}-1\}$.

9. A binary logic circuit as claimed in claim 2, wherein first formatting hardware circuit is further configured to truncate a set of least significant bits of the mw mantissa bits that would not form part of the fw bits of the fixed point format if left-shifted by a value equal to the shift range of the first shifter.

10. A binary logic circuit as claimed in claim 1, wherein the first shifter has a shift range limited to the minimum of: i) $iw-2-s_y$; and ii) $2^{ew-1}-2$.

11. A binary logic circuit as claimed in claim 1, wherein the floating point format and fixed point format are such that $(iw-s_y-1)<2^{ew-1}-1$, and k is equal to the bit width of the value $(iw-s_y-2)$; or the floating point format and fixed point format are such that $2^{ew-1}-1 \le (iw-s_y-1)$, and $k=ew-1$, where $s_y=1$ for a signed floating point number and $s_y=0$ for an unsigned floating point number.

12. A binary logic circuit as claimed in claim 1, further comprising a second formatting hardware circuit coupled to the second shifter, the second formatting hardware circuit configured to receive as an input string comprising the mw mantissa bits and to format the string to generate the second significand input to the second shifter.

13. A binary logic circuit as claimed in claim 12, wherein the second formatting hardware circuit is configured to truncate the (mw−fw) least significant bits of the mantissa when mw>fw.

14. A binary logic circuit as claimed in claim 1, wherein the second shifter has a bit width equal to: $(1+s_y)+\min(fw, mw+2^{ew-1}-2)$.

15. A binary logic circuit as claimed in claim 1, wherein the second shifter has a shift range limited to the minimum of: i) $2^{ew-1}-2$; and ii) fw.

16. A binary logic circuit as claimed in claim 1, further comprising a third formatting hardware circuit coupled to the second shifter, the third formatting hardware circuit being configured to append $(iw-1-s_y)$ bits to the most significant bit of the second output, where $s_y=0$ and the appended bits are zero bits for an unsigned floating point number, and $s_y=1$ and the appended bits are sign bits for a signed floating point number.

17. A binary logic circuit as claimed in claim 1, wherein the floating point format and fixed point format are such that $fw<2^{ew-1}-1$ and p is equal to the bit width to represent fw; or the floating point and fixed point numbers are such that $fw\geq 2^{ew-1}-1$ and p=ew−1.

18. A binary logic circuit as claimed in claim 1, wherein the binary logic circuit further comprises exception-handling circuitry configured to output an exception result in response to detecting an exception condition from a set of exception conditions comprising at least one of: i) $E>B+iw-1-s_y$; ii) $E<B-fw$, where $s_y=1$ for a signed number and $s_y=0$ for an unsigned number; and the binary logic circuit further comprises an output multiplexer configured to multiplex between the exception result and the output from the multiplexer coupled to the first and second shifters.

19. A method of converting a number in floating point format having an exponent E of ew bits, an exponent bias B given by $B=2^{ew-1}-1$, and a significand comprising a mantissa M of mw bits into a fixed point format with an integer width of iw bits and a fractional width of fw bits, the method comprising:

receiving at a first shifter a first significand input comprising a contiguous set of the most significant bits of the significand and left-shifting the first significand input by a number of bits equal to the value represented by k least significant bits of the exponent to generate a first output, wherein $\min\{(ew-1), \text{bitwidth}(iw-2-s_y)\}\leq k\leq(ew-1)$ where $s_y=1$ for a signed floating point number and $s_y=0$ for an unsigned floating point number;

inverting at an inverting hardware circuit the bit values of the exponent;

receiving at a second shifter a second significand input comprising a contiguous set of the most significant bits of the significand and right-shifting the second significand input by a number of bits equal to the value represented by the p least significant bits of the inverted exponent to generate a second output, wherein $\min\{(ew-1), \text{bitwidth}(fw)\}\leq p\leq(ew-1)$; and receiving at a multiplexer a first input comprising a contiguous set of bits of the first output and a second input comprising a contiguous set of bits of the second output and outputting the first input if the most significant bit of the exponent is equal to one and outputting the second input if the most significant bit of the exponent is equal to zero.

20. A non-transitory computer readable storage medium having stored thereon a computer readable description of a binary logic circuit for converting a number in floating point format having an exponent E of ew bits, an exponent bias B given by $B=2^{ew-1}-1$, and a significand comprising a mantissa M of mw bits into a fixed point format with an integer width of iw bits and a fractional width of fw bits that, when processed in an integrated circuit manufacturing system, causes the integrated circuit manufacturing system to manufacture an integrated circuit embodying the binary logic circuit, the binary logic circuit comprising:

a first shifter operable to receive a first significand input comprising a contiguous set of the most significant bits of the significand and configured to left-shift the first significand input by a number of bits equal to the value represented by k least significant bits of the exponent to generate a first output, wherein $\min\{(ew-1), \text{bitwidth}(iw-2-s_y)\}\leq k\leq(ew-1)$ where $s_y=1$ for a signed floating point number and $s_y=0$ for an unsigned floating point number;

an inverting hardware circuit configured to invert the bit values of the exponent;

a second shifter coupled to the inverting hardware circuit configured to receive a second significand input comprising a contiguous set of the most significant bits of the significand and configured to right-shift the second significand input by a number of bits equal to the value represented by the p least significant bits of the inverted exponent to generate a second output, wherein $\min\{(ew-1), \text{bitwidth}(fw)\}\leq p\leq(ew-1)$; and a multiplexer coupled to the first and second shifters and configured to: receive a first input comprising a contiguous set of bits of the first output and a second input comprising a contiguous set of bits of the second output; and output the first input if the most significant bit of the exponent is equal to one; and output the second input if the most significant bit of the exponent is equal to zero.

* * * * *

UNITED STATES PATENT AND TRADEMARK OFFICE
CERTIFICATE OF CORRECTION

PATENT NO. : 10,558,428 B2
APPLICATION NO. : 15/935313
DATED : February 11, 2020
INVENTOR(S) : Rovers Page 1 of 1

It is certified that error appears in the above-identified patent and that said Letters Patent is hereby corrected as shown below:

In the Specification

Column 3, Line 59, please delete "(iw-sy2)" and insert --(iw-sy-2)--

Column 5, Line 57, please delete "ii) E$\leq$B+iw-1-sy" and insert --ii) E<B+iw-1-sy--

Column 17, Line 38, please delete "exponent E" and insert --exponent $\bar{E}$--

Signed and Sealed this
Twenty-eighth Day of December, 2021

Drew Hirshfeld
*Performing the Functions and Duties of the
Under Secretary of Commerce for Intellectual Property and
Director of the United States Patent and Trademark Office*